(12) United States Patent
Nishiwaki et al.

(10) Patent No.: US 9,099,370 B2
(45) Date of Patent: Aug. 4, 2015

(54) SOLID-STATE IMAGING ELEMENT AND IMAGING DEVICE

(71) Applicant: Panasonic Corporation, Osaka (JP)

(72) Inventors: Seiji Nishiwaki, Hyogo (JP); Tatsuya Nakamura, Osaka (JP); Masao Hiramoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/359,094

(22) PCT Filed: Sep. 2, 2013

(86) PCT No.: PCT/JP2013/005178
§ 371 (c)(1),
(2) Date: May 17, 2014

(87) PCT Pub. No.: WO2014/034149
PCT Pub. Date: Mar. 6, 2014

(65) Prior Publication Data
US 2014/0333796 A1    Nov. 13, 2014

(30) Foreign Application Priority Data

Sep. 3, 2012 (JP) ................................. 2012-193029
Sep. 3, 2012 (JP) ................................. 2012-193030

(51) Int. Cl.
*H04N 5/225* (2006.01)
*H01L 27/146* (2006.01)
(Continued)

(52) U.S. Cl.
CPC .... *H01L 27/14625* (2013.01); *H01L 27/14621* (2013.01); *H01L 27/14629* (2013.01); *H04N 5/225* (2013.01); *H04N 5/2254* (2013.01); *H04N 9/045* (2013.01); *H04N 9/07* (2013.01)

(58) Field of Classification Search
CPC ..... H04N 5/2254; H04N 5/225; H04N 9/045; H04N 9/07; H04N 9/097; H01L 27/14625; H01L 27/14627; H01L 27/14629; H01L 27/14621
See application file for complete search history.

(56) References Cited

U.S. PATENT DOCUMENTS 8,208,052 B2 * 6/2012 Hiramoto et al. ............. 348/294
2007/0235756 A1 * 10/2007 Kato ............................. 257/184
(Continued)

FOREIGN PATENT DOCUMENTS

JP    09-321262 A    12/1997
JP    2007-282054 A  10/2007
(Continued)

OTHER PUBLICATIONS

Search Report for corresponding International Application No. PCT/JP2013/005178 dated Nov. 26, 2013.
(Continued)

*Primary Examiner* — Nicholas Giles
(74) *Attorney, Agent, or Firm* — Renner, Otto, Boisselle & Sklar, LLP

(57) ABSTRACT

A solid-state image sensor includes a dispersing element array which is arranged to face a photosensitive cell array and which includes a plurality of high-refractive-index transparent portions, a low-refractive-index transparent layer that fills a gap between the high-refractive-index transparent portions, and pairs of dispersing elements arranged to face multiple unit blocks of the photosensitive cell array. Each pair of dispersing elements is comprised of: a first dispersing element which includes one of the high-refractive-index transparent portions and which splits incoming light into two light rays representing first and second color components, respectively; and a second dispersing element which includes another one of the high-refractive-index transparent portions and which splits the incoming light into two light rays representing third and fourth color components, respectively.

17 Claims, 31 Drawing Sheets

(51) Int. Cl.
*H04N 9/07* (2006.01)
*H04N 9/04* (2006.01)

(56) References Cited

U.S. PATENT DOCUMENTS

| | | |
|---|---|---|
| 2010/0176473 A1 | 7/2010 | Nishiwaki |
| 2010/0188537 A1* | 7/2010 | Hiramoto et al. ............ 348/294 |
| 2011/0007179 A1* | 1/2011 | Hiramoto et al. .......... 348/222.1 |
| 2011/0037869 A1* | 2/2011 | Hiramoto et al. .......... 348/222.1 |
| 2011/0192962 A1 | 8/2011 | Nishiwaki et al. |
| 2012/0182453 A1* | 7/2012 | Hiramoto et al. ............ 348/272 |
| 2012/0206637 A1* | 8/2012 | Hiramoto et al. ............ 348/311 |
| 2013/0099343 A1 | 4/2013 | Toshikiyo et al. |
| 2013/0135493 A1* | 5/2013 | Hiramoto et al. .......... 348/222.1 |

FOREIGN PATENT DOCUMENTS

| | | |
|---|---|---|
| JP | 2012-049619 A | 3/2012 |
| WO | WO 2009/019818 A1 | 2/2009 |

OTHER PUBLICATIONS

Form PCT/ISA/237 for corresponding International Application No. PCT/JP2013/005178 dated Nov. 26, 2013 and a partial English translation.

\* cited by examiner

| 1Y | 1C |
|----|----|
| 1G | 1M |

(b)

| 1G | 1M |
|----|----|
| 1Y | 1C |

(c)

| 1C | 1Y |
|----|----|
| 1M | 1G |

(d)

| 1M | 1G |
|----|----|
| 1C | 1Y |

(a)

(e)

(b)

(f)

(c)

(g)

(d)

(h)

(i)

(a)

(b)

(a)

(b)

(a)

| 1Y | 1C |
|----|----|
| 1G | 1M |

(c)

| 1C | 1Y |
|----|----|
| 1M | 1G |

(b)

| 1G | 1M |
|----|----|
| 1Y | 1C |

(d)

| 1M | 1G |
|----|----|
| 1C | 1Y |

(e)

SOLID-STATE IMAGING ELEMENT AND IMAGING DEVICE

TECHNICAL FIELD

The present application relates to a solid-state image sensor and an image capture device including the solid-state image sensor.

BACKGROUND ART

Various kinds of conventional color image capture devices including digital still cameras and camcorders have used a solid-state image sensor (which will be sometimes simply referred to herein as an "image sensor") with a color mosaic filter. The color mosaic filter has a configuration in which multiple kinds of color filters with mutually different light transmission properties are arranged two-dimensionally on a pixel-by-pixel basis. Each of those color filters has the property of selectively transmitting a light ray falling within a particular wavelength range and absorbing a light ray falling within any other wavelength range. In a typical example, an R filter which transmits a red (R) ray, a G filter which transmits a green (G) ray, and a B filter which transmits a blue (B) ray are used.

However, the use of such color filters decreases the quantity of light to be incident on the photosensing section of a solid-state image sensor and lowers the efficiency with which the incoming light is used. Thus, Patent Document No. 1 discloses an image sensor which uses a "dispersing element" instead of the color filter in order to use the incoming light more efficiently. The dispersing element disclosed in Patent Document No. 1 is a phase shifter which is arranged on a pixel (photodiode) basis, and has a light-splitting function which makes a light ray representing a particular color incident on an associated photodiode and also makes a light ray representing its complementary color incident on another photodiode.

CITATION LIST

Patent Literature

Patent Document No. 1: PCT International Application Publication No. 2009/019818

SUMMARY OF INVENTION

Technical Problem

An embodiment of the present invention provides a novel solid-state image sensor and image capture device including a dispersing element.

Solution to Problem

A solid-state image sensor according to the present disclosure includes: a photosensitive cell array in which a plurality of unit blocks, each including first, second, third and fourth photosensitive cells, are arranged two-dimensionally on an imaging area; and a dispersing element array which is arranged so as to face the photosensitive cell array and which includes a plurality of high-refractive-index transparent portions and a low-refractive-index transparent layer that has a lower refractive index than the plurality of high-refractive-index transparent portions and that fills a gap between the high-refractive-index transparent portions. The dispersing element array includes multiple pairs of dispersing elements which are arranged so as to face the multiple unit blocks of the photosensitive cell array. Each of the multiple pairs of dispersing elements is comprised of: a first dispersing element which includes one of the plurality of high-refractive-index transparent portions and which splits incoming light into two light rays representing first and second color components, respectively; and a second dispersing element which includes another one of the plurality of high-refractive-index transparent portions and which splits the incoming light into two light rays representing third and fourth color components, respectively. The first dispersing element is arranged to make the light ray representing the first color component incident on the first photosensitive cell and also make the light ray representing the second color component incident on a pair of the second photosensitive cells which are adjacent to the first photosensitive cell. And the second dispersing element is arranged to make the light ray representing the third color component incident on the third photosensitive cell and also make the light ray representing the fourth color component incident on a pair of the fourth photosensitive cells which are adjacent to the third photosensitive cell.

Advantageous Effects of Invention

According to embodiments of the present invention, sufficiently high optical efficiency and resolution can be achieved by adopting a new arrangement for dispersing elements.

BRIEF DESCRIPTION OF DRAWINGS

[FIG. 9] (a) to (d) are plan views illustrating arrangements of four adjacent photosensitive cells in the photosensitive cell array of this embodiment.

[FIG. 24] A perspective view illustrating a portion of a structure in which a pattern for an additional low-refractive-index transparent layer 2a' has been formed on a first low-refractive-index transparent layer 2a.

DESCRIPTION OF EMBODIMENTS

<Basic Configuration of Solid-State Image Sensor>

First of all, it will be described with reference to the accompanying drawings what basic configuration a solid-state image sensor according to an embodiment of the present disclosure has and how the image sensor operates in principle. In the following description, to spatially split incoming light into multiple components of light falling within mutually different wavelength ranges or having respectively different color components will be sometimes referred to herein as "splitting of light". Also, the minimum spatial unit for sensing light will be referred to herein as a "photosensitive cell" or a "pixel". In the following description, the "pixel pitch" means the interval between respective centers of photosensitive cells, a plane which is parallel to the imaging area will be referred to herein as an "xy plane", the horizontal and vertical directions on the imaging area will be referred to herein as "x axis" and "y axis", respectively, and the direction that intersects with the imaging area at right angles will be referred to herein as "z axis".

Figure 1:
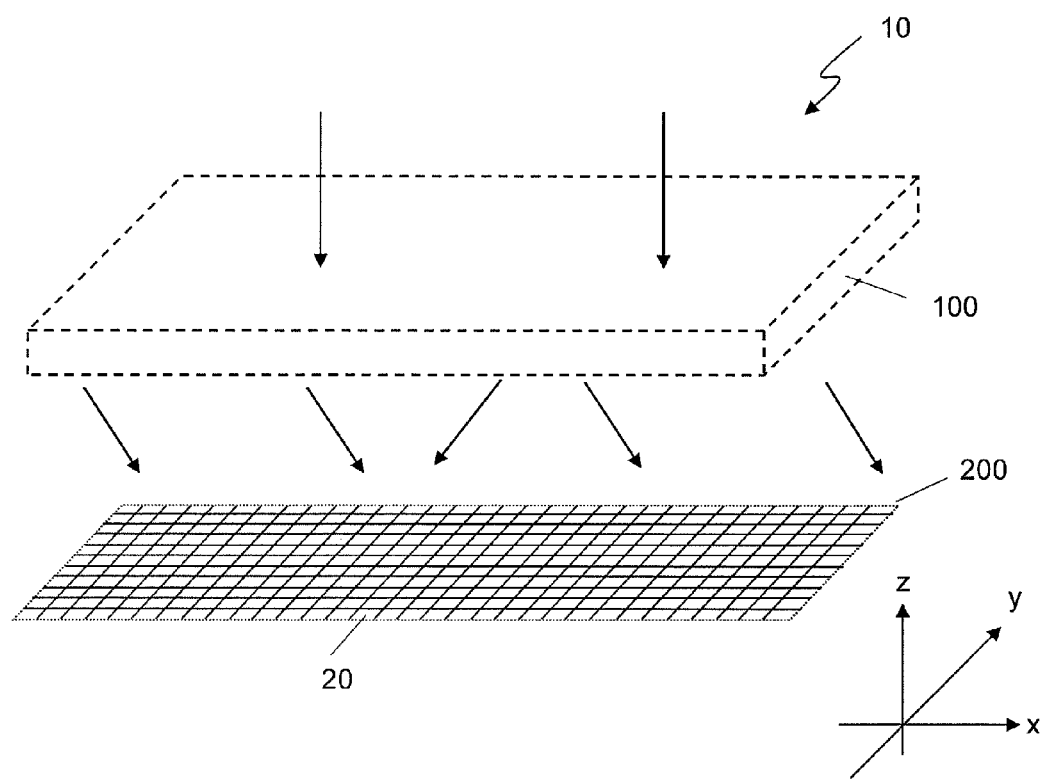
[FIG. 1] Illustrates a basic configuration and operating principle for a solid-state image sensor as an embodiment of the present disclosure.

As shown in FIG. 1, the solid-state image sensor 10 of the present disclosure includes a photosensitive cell array 200 in which a plurality of photosensitive cells 20 are arranged two-dimensionally on the imaging area and a dispersing element array 200 which is arranged so as to face the photosensitive cell array 200. As will be described in detail later, in an embodiment of the present disclosure, four photosensitive cells 20 which function as a fundamental unit to produce a color image signal form a "unit block", and such unit blocks are arranged in columns and rows on the imaging area.

Figure 2:
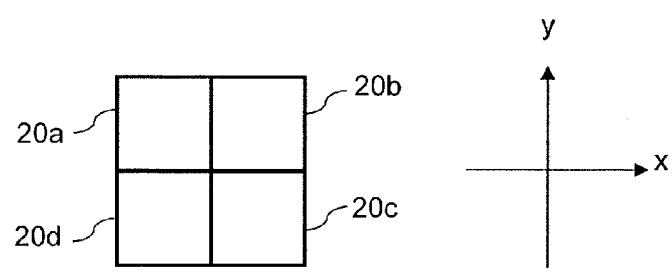
[FIG. 2] A plan view schematically illustrating an exemplary configuration for a single unit block which has been selected arbitrarily from a photosensitive cell array 200.

FIG. 2 is a plan view schematically illustrating an exemplary configuration for a unit block which has been selected arbitrarily from the photosensitive cell array 200. In the photosensitive cell array 200, each of a plurality of unit blocks includes first, second, third and fourth photosensitive cells 20a, 20b, 20c and 20d. In the example illustrated in FIG. 2, four photosensitive cells 20a, 20b, 20c and 20d which have been defined to have a square shape are arranged in two columns and two rows. However, the photosensitive cells 20a, 20b, 20c and 20d do not have to be arranged in such a pattern in each unit block. Each photosensitive cell includes at least one photoelectric transducer and may include an additional element such as a switching transistor, for example. The photoelectric transducer is typically a photodiode. The photosensitive cell array 200 is the photosensing section of an image sensor which is typically implemented as a CMOS or a CCD and is fabricated by known semiconductor processing technologies.

In the photosensitive cell array 200, provided actually are lines to connect the respective photosensitive cells 20a, 20b, 20c and 20d to a read circuit (not shown). However, those lines are not illustrated on the drawings of the present application for the sake of simplicity.

Figure 3:
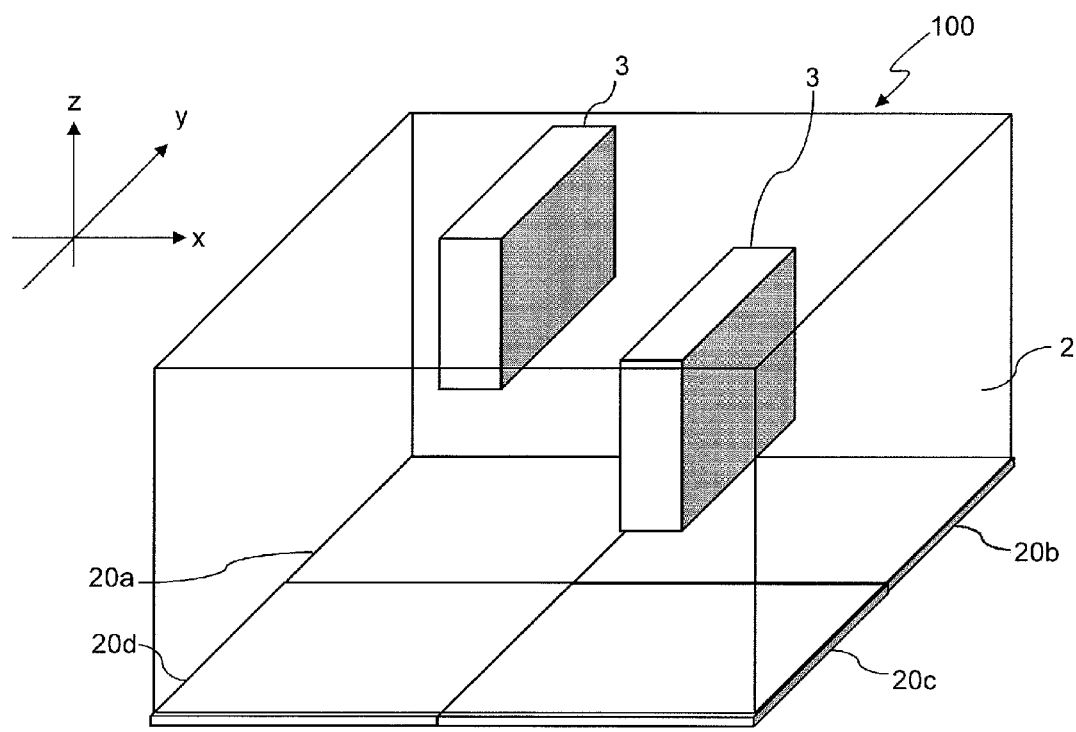
[FIG. 3] A perspective view illustrating a portion of a dispersing element array 100.

FIG. 3 is a perspective view illustrating a portion of the dispersing element array 100. In FIG. 3, illustrated is only a portion of the dispersing element array 100 that faces a single unit block formed by the four adjacent photosensitive cells 20a, 20b, 20c and 20d for the sake of simplicity. Actually, however, the structure shown in FIG. 3 is formed everywhere on the imaging area.

As shown in FIG. 3, the dispersing element array 100 includes a plurality of high-refractive-index transparent portions 3 and a low-refractive-index transparent layer 2 which fills the gap between those high-refractive-index transparent portions 3. The refractive index of the low-refractive-index transparent layer 2 is lower than that of the high-refractive-index transparent portions 3. In this description, these terms "high-refractive-index" and "low-refractive-index" do not indicate the absolute levels of the refractive indices but refer to only relative levels of the refractive indices to be compared to each other. That is to say, the "low-refractive-index" just means that the refractive index of the low-refractive-index transparent layer 2 is "lower than" that of the high-refractive-index transparent portions 3. On the other hand, the "high-refractive-index" just means that the refractive index of the high-refractive-index transparent portions 3 is "higher than" that of the low-refractive-index transparent layer 2. That is why as long as the refractive index of the low-refractive-index transparent layer 2 is lower than that of the high-refractive-index transparent portions 3, their refractive indices may be arbitrary ones.

The respective high-refractive-index transparent portions 3 which are embedded in the low-refractive-index transparent layer 2 locally decrease the phase velocity of the light that has been incident on the low-refractive-index transparent layer 2. As a result, when the light that has been incident on the upper surface of the low-refractive-index transparent layer 2 propagate toward the lower surface, a phase shift is caused to a degree that varies according to the wavelength and the incoming light is split. For that reason, each high-refractive-index transparent portion 3 will be referred to herein as a "dispersing element". Such a dispersing element may also be called a "phase shifter". In the example illustrated in FIG. 3, the high-refractive-index transparent portion 3 has a plate shape and has a rectangular parallelepiped shape, of which one side in the x-axis direction is shorter than another side in the y-axis direction. The high-refractive-index transparent portion does not have to have an exactly rectangular parallelepiped shape but may also have rounded edges or a tapered or inversely tapered cross section. In this description, the term "plate shape" will refer broadly to any shape in which the size of the high-refractive-index transparent portion as measured in the x-axis direction is smaller than its size as measured in the y- or z-axis direction.

In the example illustrated in FIG. 3, two dispersing elements are arranged in a single unit block. These two dispersing elements will be referred to herein as a "pair of dispersing elements". Each pair of dispersing elements is comprised of a first dispersing element 3G which splits the incoming light into two light rays representing first and second color components, respectively, and a second dispersing element 3C which splits the incoming light into two light rays representing third and fourth color components, respectively. If the incoming light is white light, the second color component corresponds to the complementary color of the first color component and the fourth color component corresponds to the complementary color of the third color component. FIG. 4(a) is a plan view illustrating an exemplary relative arrangement of the two dispersing elements 3G and 3C that form a pair and the photosensitive cells 20a, 20b, 20c and 20d.

In one embodiment, the first dispersing element 3G is arranged to make the light ray representing the first color component (which may be the color green, for example) incident on the first photosensitive cell 20a and also make the light ray representing the second color component (which may be the color magenta, for example) incident on the second photosensitive cell 20b which is adjacent to the first photosensitive cell 20a. On the other hand, the second dispersing element 3C is arranged to make the light ray representing the third color component (which may be the color cyan, for example) incident on the third photosensitive cell 20c and also make the light ray representing the fourth color component (which may be the color yellow, for example) incident on the fourth photosensitive cell 20d which is adjacent to the third photosensitive cell 20c. By adjusting the size, shape, refractive index and other parameters of the high-refractive-index transparent portion 3, splitting of the incoming light can be controlled. The configuration and function of the high-refractive-index transparent portion 3 are disclosed in further detail in Patent Document No. 1, the entire disclosure of which is hereby incorporated by reference.

It should be noted that even if the first and second color components are complementary colors, the wavelength ranges of the light rays with the first and second color components do not have to be completely separate from each other but may partially overlap with each other. Likewise, the wavelength ranges of the light rays with the third and fourth color components may partially overlap with each other, too.

Figure 5A:
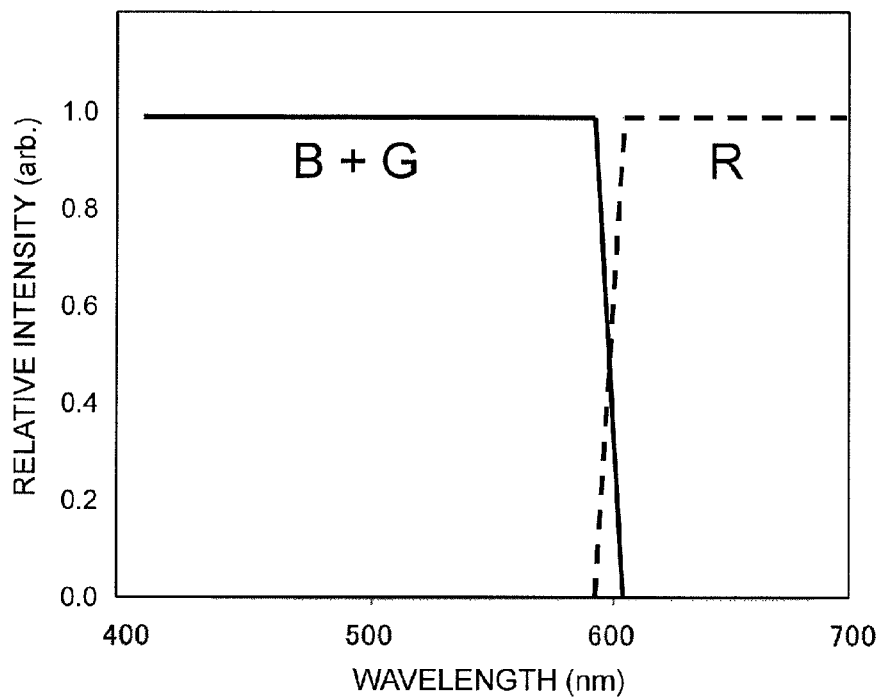
[FIG. 5A] A graph schematically showing an exemplary relation between the relative intensity of third and fourth color components and the wavelength.

FIG. 5A is a graph schematically showing an exemplary relation between the relative intensity of the third and fourth color components and the wavelength. In this graph, the third color component is indicated by the solid line and the fourth color component is indicated by the dashed line. In this example, the third color component includes the colors blue (B) and green (G) components at approximately equal intensities. In this case, the fourth color component consists mostly of the color red (R) and includes no color green (G) component. That is why in this example, the third color component is a typical color cyan (C) and the fourth color component is the color red (R).

Figure 5B:
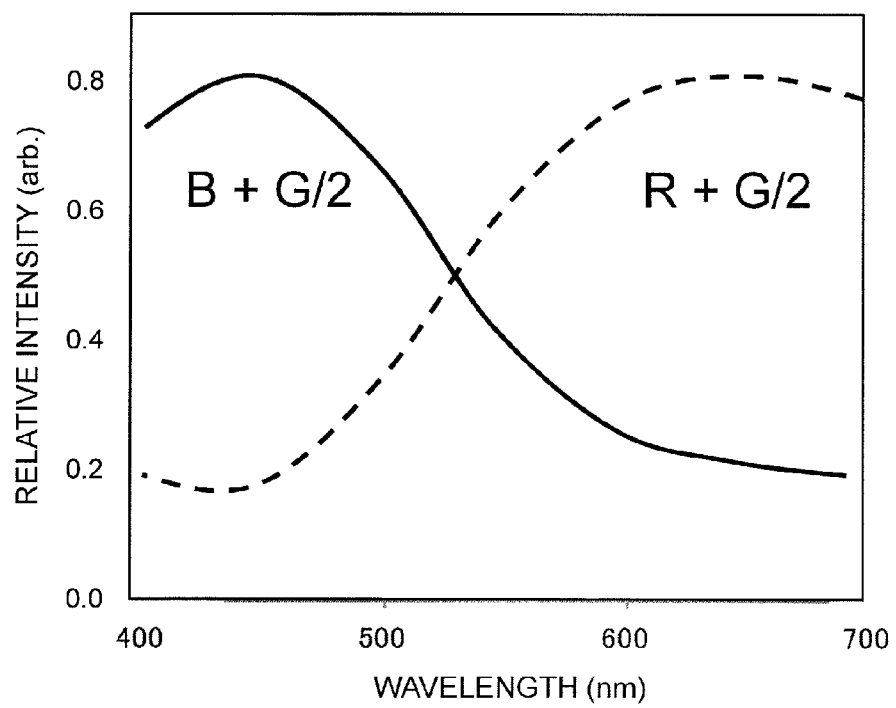
[FIG. 5B] A graph schematically showing another exemplary relation between the relative intensity of the third and fourth color components and the wavelength.

FIG. 5B is a graph schematically showing another exemplary relation between the relative intensity of the third and fourth color components and the wavelength. In general, in a situation where the intensity of a color component is represented by a wavelength function which changes approximately by a factor of $\sin^2$, if that color component is removed from white light by splitting the white light, the intensity of the remaining color component can be represented by a wavelength function which changes approximately by a factor of $\cos^2$. $\sin^2+\cos^2$ is constant irrespective of the wavelength and corresponds to the spectrum of white light. In the example shown in FIG. 5B, the third and fourth color components have such a spectrum.

In general, the complementary color of the color cyan (C) is the color red (R), and includes both of the colors green (G) and blue (B) components. If the color green (G) component accounts for a relatively small percentage of the color cyan (C), however, the complementary color of such a color cyan (C) is not quite the color red (R) but may be a color with a tint of the color green (G) component, i.e., a color yellow (Y) component in the broad sense.

The dispersing element 3C for use in this embodiment can split white light into light rays with the color components such as the ones shown in FIG. 5B. That is why the complementary color of the color cyan (C) is supposed to be the color yellow (Y) in the following description. However, this is just an example of the present invention.

If the colors of the light rays incident on the photosensitive cells 20a, 20b, 20c and 20d are the colors green (G), magenta (M), cyan (C) and yellow (Y), respectively, it will be convenient to identify the photosensitive cells 20a, 20b, 20c and 20d by 1G, 1M, 1C and 1Y, respectively. FIG. 4(b) is a plan view illustrating an exemplary arrangement of those photosensitive cells 1G, 1M, 1C and 1Y.

<Embodiment 1>

Figure 6:
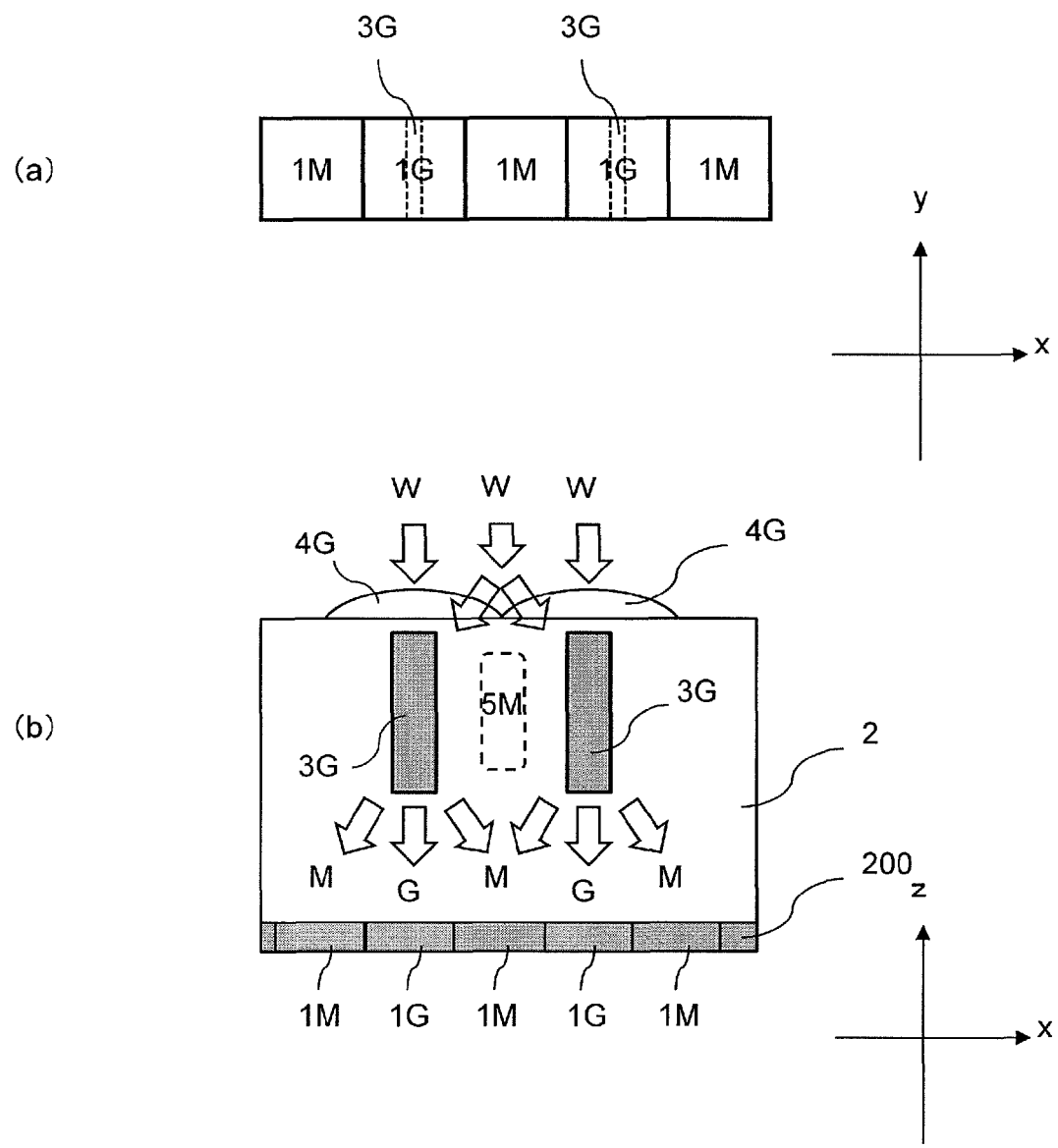
[FIG. 6] (a) is a plan view illustrating a row of the photosensitive cell array 200 on which photosensitive cells 1M and 1G are arranged alternately, and (b) is a schematic representation illustrating a cross-sectional structure of a portion of the dispersing element 3G which faces that row.
Figure 7:
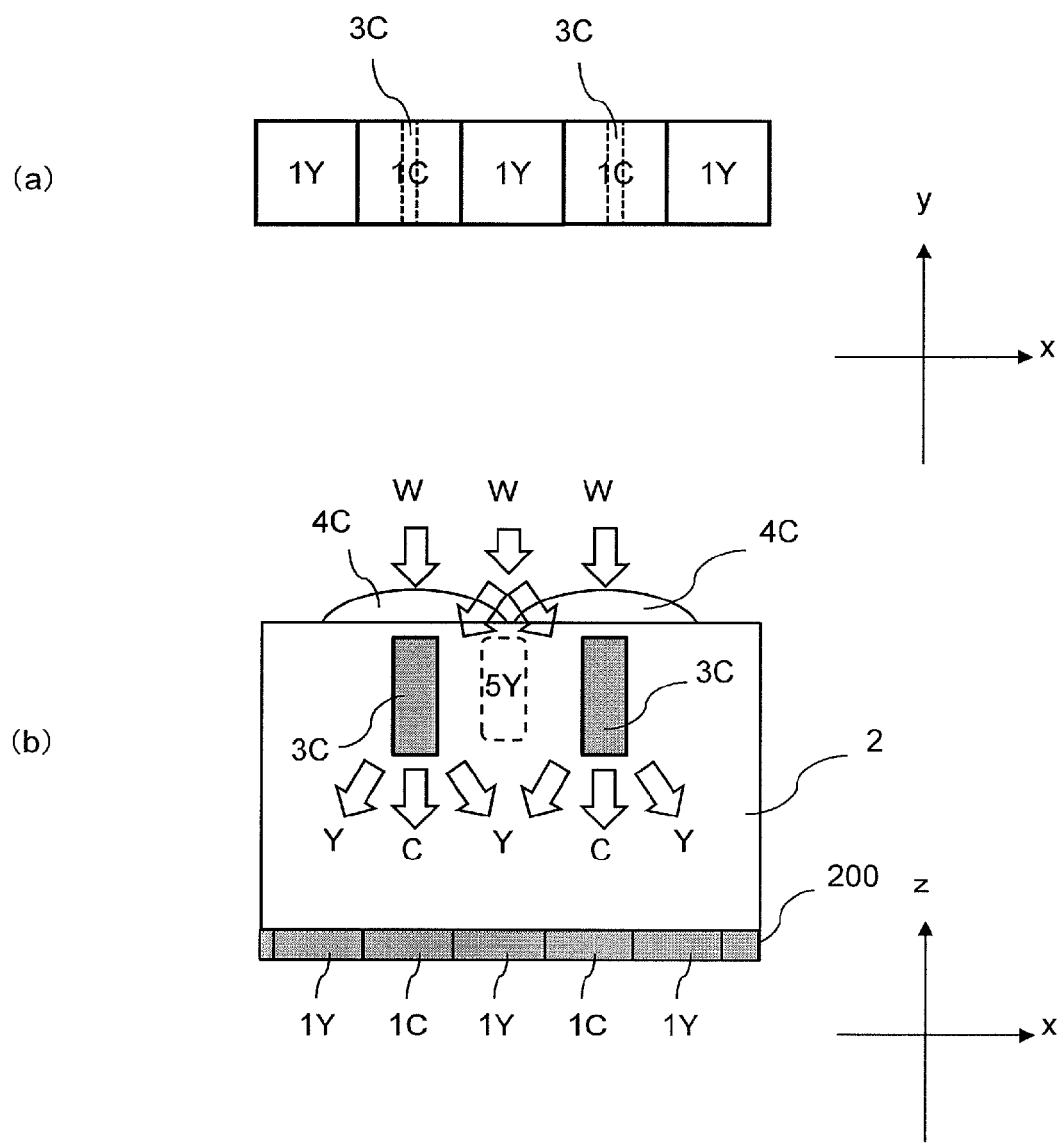
[FIG. 7] (a) is a plan view illustrating a row of the photosensitive cell array 200 on which photosensitive cells 1C and 1Y are arranged alternately, and (b) is a schematic representation illustrating a cross-sectional structure of a portion of the dispersing element 3C which faces that row.

FIG. 6(a) is a plan view illustrating a row of the photosensitive cell array 200 on which photosensitive cells 1M and 1G are arranged alternately, and FIG. 6(b) is a schematic representation illustrating a cross-sectional structure of a portion of the dispersing element 3G which faces that row. On the other hand, FIG. 7(a) is a plan view illustrating a row of the photosensitive cell array 200 on which photosensitive cells 1C and 1Y are arranged alternately, and FIG. 7(b) is a schematic representation illustrating a cross-sectional structure of a portion of the dispersing element 3C which faces that row.

Figure 4:
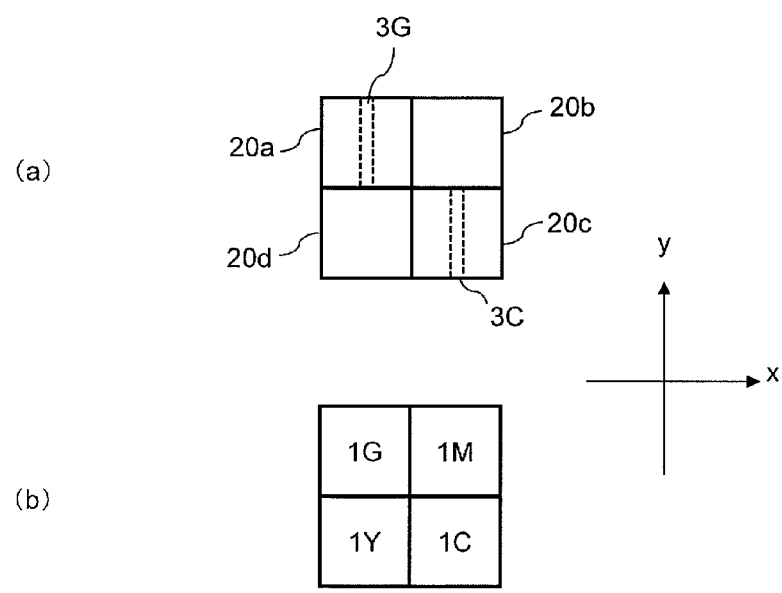
[FIG. 4] (a) is a plan view illustrating an exemplary relative arrangement of two dispersing elements 3G and 3C that form a pair and photosensitive cells 20a, 20b, 20c and 20d and (b) is a plan view illustrating an exemplary arrangement of those photosensitive cells 1G, 1M, 1C and 1Y.

As shown in FIGS. 4, 6(b) and 7(b), the high-refractive-index transparent portions 3 that form the respective dispersing elements 3G and 3C are generally parallel to the yz plane and their lower end is spaced apart from the photosensitive cell array 200. The low-refractive-index transparent layer 2 also fills the gap between the photosensitive cell array 200 and the high-refractive-index transparent portions 3. The dispersing elements 3G and 3C may be made of SiN (silicon nitride), for example, and the low-refractive-index transparent layer 2 may be made of $SiO_2$ (silicon dioxide), for example. However, this is just an example and the dispersing element array 100 may also be made of any other combination of materials. Optionally, to make a correction on the light-splitting property, a substance which absorbs light falling within a particular wavelength range may be added to a part of the high-refractive-index transparent portion or low-refractive-index transparent layer 2 that forms the dispersing elements 3G and 3C.

On the upper surface of the low-refractive-index transparent layer 2, arranged are a plurality of micro lenses 4G, 4C, each of which condenses the light onto an associated one of the dispersing elements 3G and 3C, as shown in FIGS. 6(b) and 7(b). And those micro lenses 4G and 4C form a micro lens array. In other words, the micro lens array is comprised of a first micro lens 4G which condenses light onto the first dispersing element 3G and a second micro lens 4C which condenses light onto the second dispersing element 3C.

Figure 8:
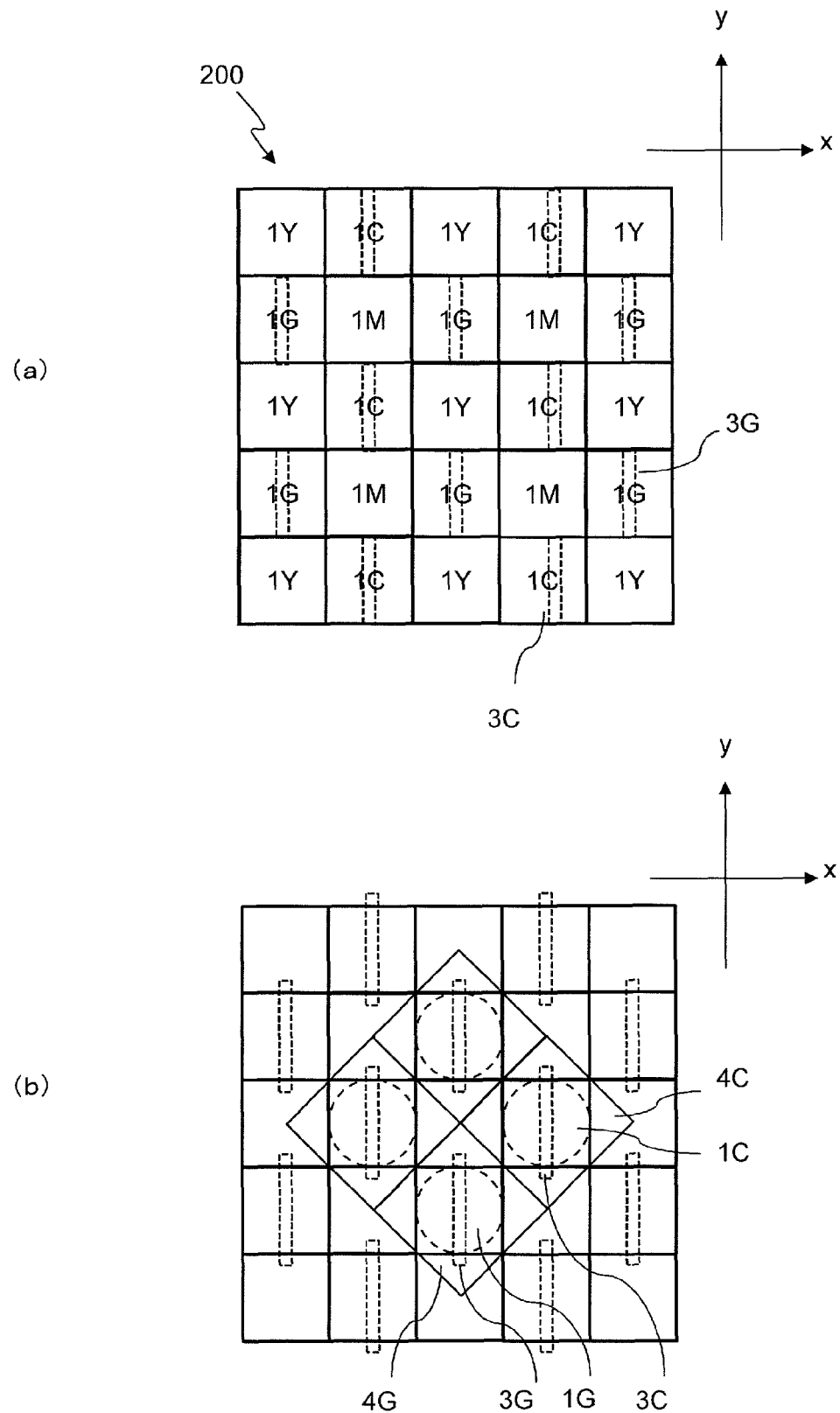
[FIG. 8] (a) is a plan view illustrating an exemplary arrangement of the photosensitive cells 1G, 1M, 1C and 1Y in the photosensitive cell array 200, and (b) is a plan view illustrating an exemplary arrangement of micro lenses 4G and 4C.

FIG. 8(a) is a plan view illustrating an exemplary arrangement of the photosensitive cells 1G, 1M, 1C and 1Y in the photosensitive cell array 200, and FIG. 8(b) is a plan view illustrating an exemplary arrangement of the micro lenses 4G and 4C. As shown in FIG. 8(a), the dispersing elements 3G and 3C are arranged so as to be white or black elements of a checkerboard pattern. That is to say, the dispersing elements 3G and 3C are arranged so as to face the photosensitive cells 1G and 1C and no dispersing elements are arranged over the photosensitive cells 1M and 1Y. On the other hand, the micro lenses 4G and 4C are arranged so as to face the dispersing elements 3G and 3C as shown in FIG. 8(b). More specifically, each of the micro lenses 4G is arranged so as to cover not only its associated photosensitive cell 1G but also portions of the photosensitive cells 1M and 1Y surrounding the photosensitive cell 1G. That is why this micro lens 4G can collect parts of the light that would be incident on the photosensitive cells 1M and 1Y, were it not for the micro lens 4G, and can get the collected light split by the dispersing element 3G. In the same way, each of the micro lenses 4C is arranged so as to cover not only its associated photosensitive cell 1C but also portions of the photosensitive cells 1M and 1Y surrounding the photosensitive cell 1C. That is why this micro lens 4C can collect parts of the light that would be incident on the photosensitive cells 1M and 1Y, were it not for the micro lens 4C, and can get the collected light split by the dispersing element 3C.

According to the pixel arrangement adopted in this embodiment, rows of photosensitive cells 1Y and 1C and rows of photosensitive cells 1G and 1M are alternately arranged in the y-axis direction as shown in FIG. 8(a). However, this pixel arrangement is only an example and the photosensitive cells 1G and 1M may change positions with each other, for example.

Only two kinds of micro lenses 4G and 4C form the micro lens array for use in this embodiment. As shown in FIG. 8(b), each of the micro lenses 4G and 4C exceeds the area of its associated photosensitive cell 1G or 1C on the xy plane. A cross section of the micro lens 4G, 4C as viewed on a plane which is parallel to the xy plane typically has a circular shape. However, the boundary between the micro lenses 4G and 4C may be located on the diagonal of the photosensitive cell 1M, 1Y. For example, if the photosensitive cells (or pixels) have a square shape, the shape of the area covered with each micro lens 4G, 4C corresponds to the shape to be obtained by increasing the size of its associated photosensitive cell 1G, 1C by a factor of √2 without shifting its center position and rotating it 45 degrees around the center position.

Now, take a look at FIG. 6(b) again. In an exemplary configuration of this embodiment, the light ray incident on each photosensitive cell 1M has been once condensed by the dispersing element 3G which is located over the adjacent photosensitive cell 1G through the micro lens 4G that covers the photosensitive cell 1M and then split by the dispersing element 3G. The dispersing element 3G selectively diffracts a light ray with a wavelength falling within the color magenta range (±first-order diffracted light rays), which forms part of the incoming white light that has entered the micro lens 4G, transmits the rest of the incoming light (i.e., a light ray with a wavelength falling within the color green range) to produce a zero-order diffracted light ray, and then makes those light rays incident on the photosensitive cells 1M and 1G, respectively. Consequently, diffracted light rays falling within the color magenta wavelength range are incident on each photosensitive cell 1M from two dispersing elements 3G which are located on right- and left-hand sides of the photosensitive cell 1M and which are adjacent to each other in the x-axis direction.

Now, take a look at FIG. 7(b) again. The light ray incident on each photosensitive cell 1Y has been once condensed by the dispersing element 3C which is located over the adjacent photosensitive cell 1C through the micro lens 4C that covers the photosensitive cell 1Y and then split by the dispersing element 3C. The dispersing element 3C selectively diffracts a light ray with a wavelength falling within the color yellow range (±first-order diffracted light rays), which forms part of the incoming white light that has entered the micro lens 4C, transmits the rest of the incoming light (i.e., a light ray with a wavelength falling within the color cyan range) to produce a zero-order diffracted light ray, and then makes those light rays incident on the photosensitive cells 1Y and 1C, respectively. Consequently, diffracted light rays falling within the color yellow wavelength range are incident on each photosensitive cell 1Y from two dispersing elements 3C which are located on right- and left-hand sides of the photosensitive cell 1Y and which are adjacent to each other in the x-axis direction.

If a light ray has been incident on a region which is located right over a photosensitive cell 1M, 1Y, the light ray is directed toward the dispersing element 3G, 3C by the micro lens 4G, 4C. Furthermore, since the dispersing element 3G, 3C having a higher refractive index than the surrounding portion also functions as a waveguide that guides the incoming light, there will be no light (or optical path) in the region 5M, 5Y which is located beside the dispersing element 3G, 3C and right over the photosensitive cell 1M, 1Y. That is why neither the region 5M located right over the photosensitive cell 1M nor the region 5Y located right over the photosensitive cell 1Y passes the incoming light. If there is a gap between the micro lenses 4G or between the micro lenses 4C, the incoming light will pass through the gap and be incident on the upper surface of the low-refractive-index transparent layer 2 at a point right over the photosensitive cell 1M or 1Y. However, such light will also be guided and split appropriately by the dispersing element 3G, 3C.

In such a configuration, each high-refractive-index transparent portion 3 may have a size which is longer than the size of its associated photosensitive cell as measured in the y-axis direction. That is to say, each high-refractive-index transparent portion 3 may be arranged so that its end portion partially overlaps with a photosensitive cell which is adjacent to its associated photosensitive cell in the y-axis direction.

FIGS. 9(a) to 9(d) are plan views illustrating arrangements of four adjacent photosensitive cells in the photosensitive cell array of this embodiment. Each set of these four photosensitive cells includes cells in the four colors of G, M, Y and C. Consequently, according to this embodiment, an optical efficiency which is higher than, and a resolution which is almost as high as, what is achieved by a Bayer arrangement can be obtained.

Figure 10:
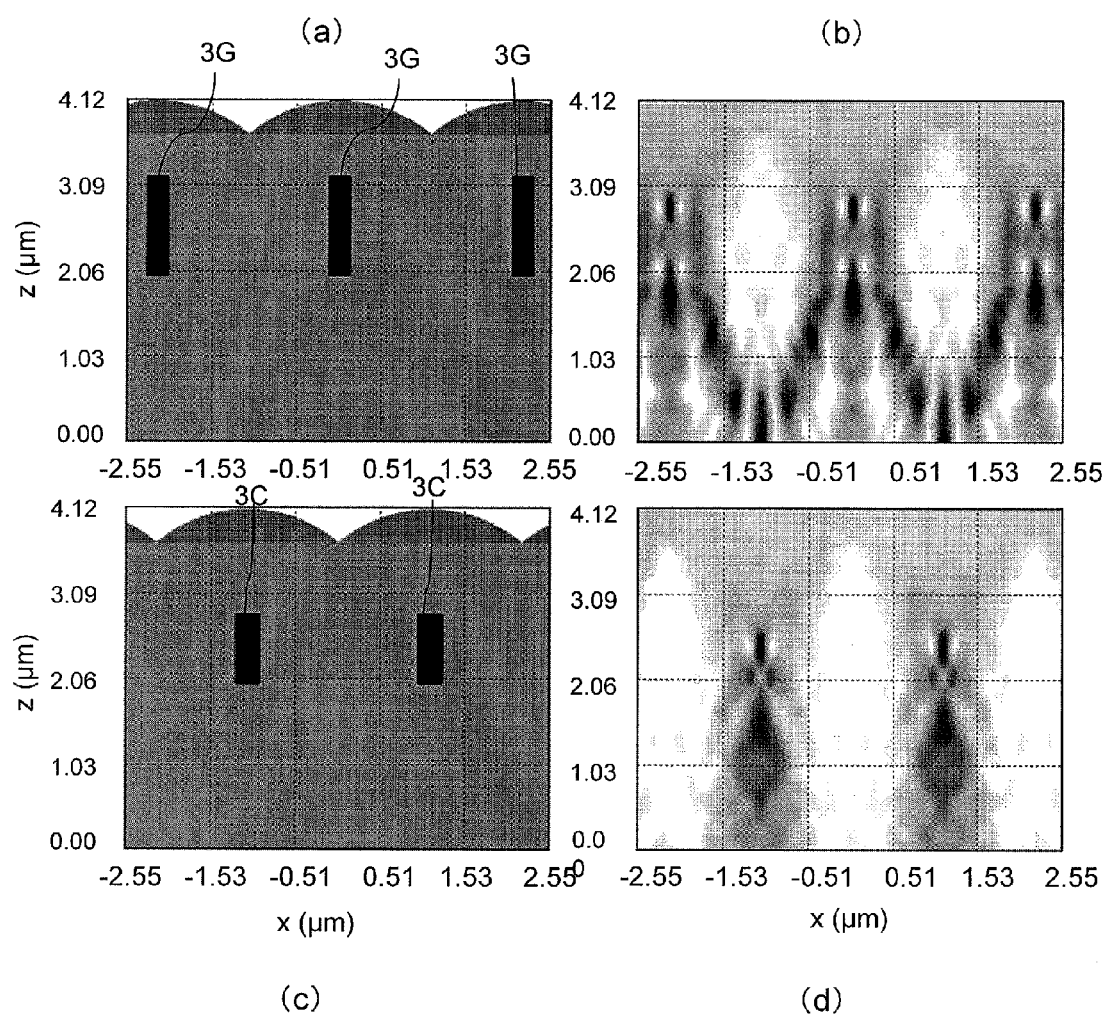
[FIGS. 10] (a) and (b) respectively show a refractive index distribution and a light intensity distribution on a cross section which passes through the center of the dispersing element 3G of this embodiment and which is parallel to the xz plane. (c) and (d) respectively show a refractive index distribution and a light intensity distribution on a cross section which passes through the center of the dispersing element 3C of this embodiment and which is parallel to the xz plane.

Next, the results of simulations that were carried out by wave motion analysis will be described with reference to FIGS. 10 and 11.

FIGS. 10(a) and 10(b) respectively show a refractive index distribution and a light intensity distribution on a cross section which passes through the center of the dispersing element 3G of this embodiment and which is parallel to the xz plane. In this example, the incoming light has a wavelength of 450 nm. In these graphs, the ordinate represents the height z (μm) as measured from the imaging area, and the abscissa is an x coordinate (in μm) which is defined with respect to the reference position as the origin. In the graph on the left-hand side, the dark regions are regions where the refractive index is set to be 2.05 and correspond to the high-refractive-index transparent portions 3 that form the dispersing elements 3G. On the other hand, the region surrounding the high-refractive-index transparent portions 3 is a region where the refractive index is set to be 1.46 and corresponds to the low-refractive-index transparent layer 2. In FIG. 10(b), the lower the lightness, the higher the light intensity. A region with a relatively high light intensity looks dark, while a region with a relatively low light intensity looks bright. As can be seen from FIGS. 10(a) and 10(b), the incoming light passes through the high-refractive-index transparent portions 3 and neighboring regions to be split into multiple light rays. As can be seen from FIG. 10(b), a region interposed between adjacent high-refractive-index transparent portions 3 looks bright and has a low light intensity. If the wavelength of the incoming light changes from 450 nm, the dark regions shown on the right hand side also change their shapes. The reason is that as the magnitude of phase shift changes with the wavelength, the wavelength distribution of split light rays changes, too.

FIGS. 10(c) and 10(d) respectively show a refractive index distribution and a light intensity distribution on a cross section which passes through the center of the dispersing element 3C of this embodiment and which is parallel to the xz plane. In this example, the incoming light has a wavelength of 450 nm. As can be seen from FIGS. 10(c) and 10(d), in this case, the incoming light also passes through the high-refractive-index transparent portions 3 that form the dispersing elements 3C and neighboring regions. The dispersing elements 3C shown in FIG. 10(c) have the property of transmitting light with a wavelength of 450 nm. That is why in FIG. 10(d), the dark regions with a high light intensity (i.e., regions through which the light passes) are located right under the high-refractive-index transparent portions and the quantity of light to be split is small.

Figure 11:
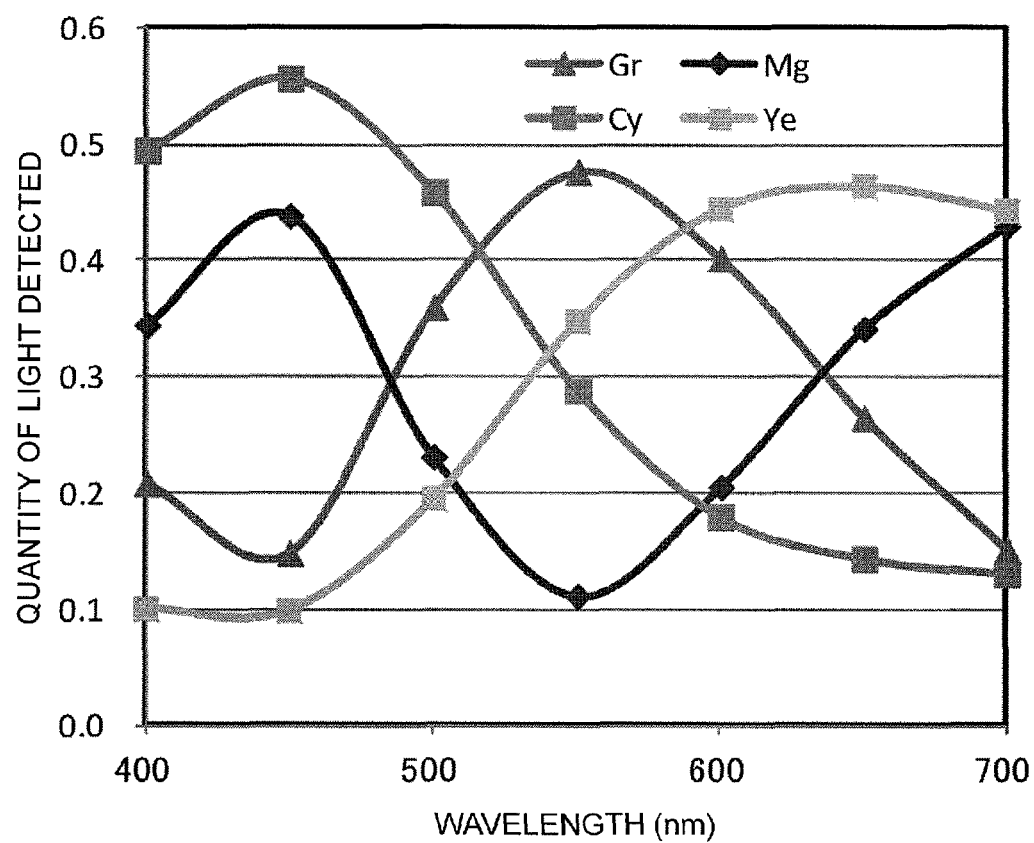
[FIG. 11] 11 A graph showing the spectra of the light rays to be incident on associated photosensitive cells 1G, 1M, 1Y and 1C in a situation where the incoming white light has been split by the dispersing element array shown in FIGS. 10(a) and 10(c).

FIG. 11 is a graph showing the spectra of the light rays to be incident on associated photosensitive cells 1G, 1M, 1Y and 1C in a situation where the incoming white light has been split by the dispersing element array shown in FIGS. 10(a) and 10(c). In this graph, the ordinate represents the quantity of light detected which is normalized with respect to the quantity of incoming light that is supposed to be the unity (i.e., 1.0) and the abscissa represents the wavelength. The curves Gr, Mg, Cy, and Ye represent the spectra of the light rays to be incident on the photosensitive cells 1G, 1M, 1C and 1Y, respectively. For example, at a wavelength of approximately 550 nm, the quantity of light detected indicated by the curve Gr is a local maximum value, and the quantity of light detected indicated by the curve Mg is a local minimum value. This means that if white light is incident on the dispersing element array, a light component with a center wavelength of 550 nm (i.e., the color green component) will be incident a lot on the photosensitive cell 1G and a light component representing the complementary color of the color green will be incident on the photosensitive cell 1M that is adjacent to the photosensitive cell 1G.

At a wavelength of approximately 450 nm, the quantity of light detected indicated by the curve Cy is a local maximum value, and the quantity of light detected indicated by the curve Ye is a local minimum value. This means that if white light is incident on the dispersing element array, a light component with a center wavelength of 450 nm (i.e., the color cyan component) will be incident a lot on the photosensitive cell 1C and a light component representing the complementary color of the color cyan (i.e., the color yellow component) will be incident on the photosensitive cell 1M that is adjacent to the photosensitive cell 1C.

In the solid-state image sensor of this embodiment, signals provided by respective photosensitive cells use different pieces of color information. That is why if a 3×4 matrix with appropriately set parameters is used, RGB color signals can be calculated by performing an arithmetic operation on that matrix.

<Embodiment 2>

Hereinafter, a second embodiment of the present disclosure will be described.

Figure 12:
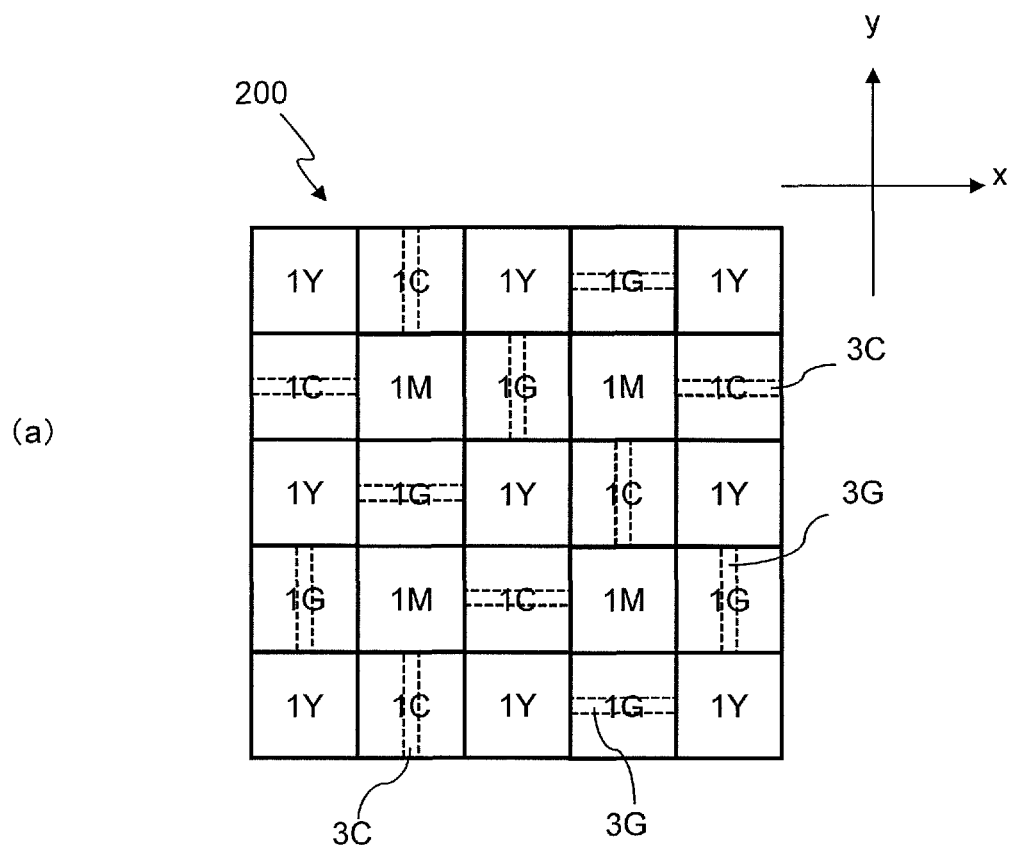
[FIG. 12] (a) is a plan view illustrating an arrangement of photosensitive cells 1G, 1M, 1C and 1Y and (b) is a plan view illustrating two sets of four photosensitive cells included in the arrangement shown in (a).
Figure 12:
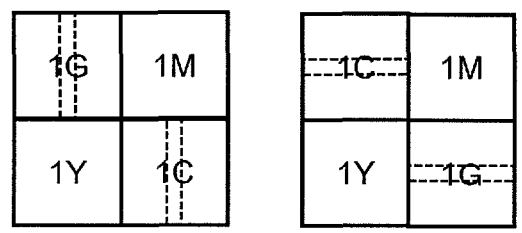

In this embodiment, the photosensitive cells 1G, 1M, 1C and 1Y are arranged as shown in FIG. 12(a). If attention is paid to 2×2 matrices, each comprised of four adjacent photosensitive cells 1G, 1M, 1C and 1Y, as shown in FIG. 12(a), it can be seen that two kinds of matrices, of which the orientations of the dispersing elements 3G and 3C intersect with each other at right angles, are arranged alternately as shown in FIG. 12(b).

As can be seen from FIG. 12(a), the dispersing elements 3G are arranged diagonally (e.g., in the 45 degree direction) on the xy plane so that their longer side alternately runs vertically and horizontally. In the same way, the dispersing elements 3C are also arranged diagonally (e.g., in the 45 degree direction) on the xy plane so that their longer side alternately runs vertically and horizontally. A photosensitive cell 1G is arranged right under each dispersing element 3G, and photosensitive cells 1M are arranged on both sides of the photosensitive cell 1G (i.e., in the direction in which the longer side of the dispersing element 3G does not run). A photosensitive cell 1C is arranged right under each dispersing element 3C, and photosensitive cells 1Y are arranged on both sides of the photosensitive cell 1C (i.e., in the direction in which the longer side of the dispersing element 3C does not run).

Figure 13:
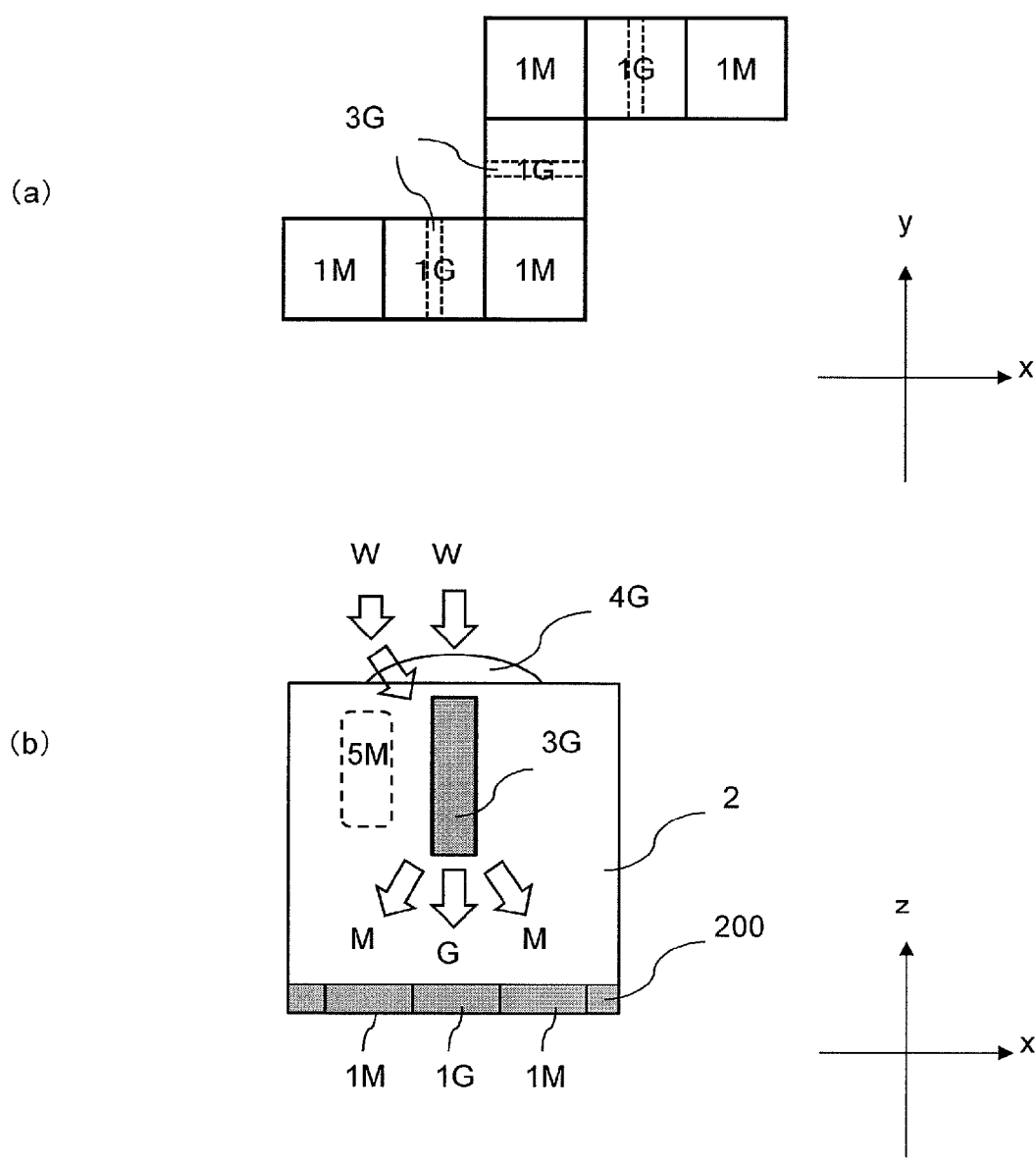
[FIG. 13] (a) is a plan view illustrating a portion of the photosensitive cell array 200 in which the photosensitive cells 1M and 1G are arranged alternately and diagonally, and (b) is a schematic representation illustrating a cross-sectional structure of a single dispersing element 3G facing that portion.
Figure 14:
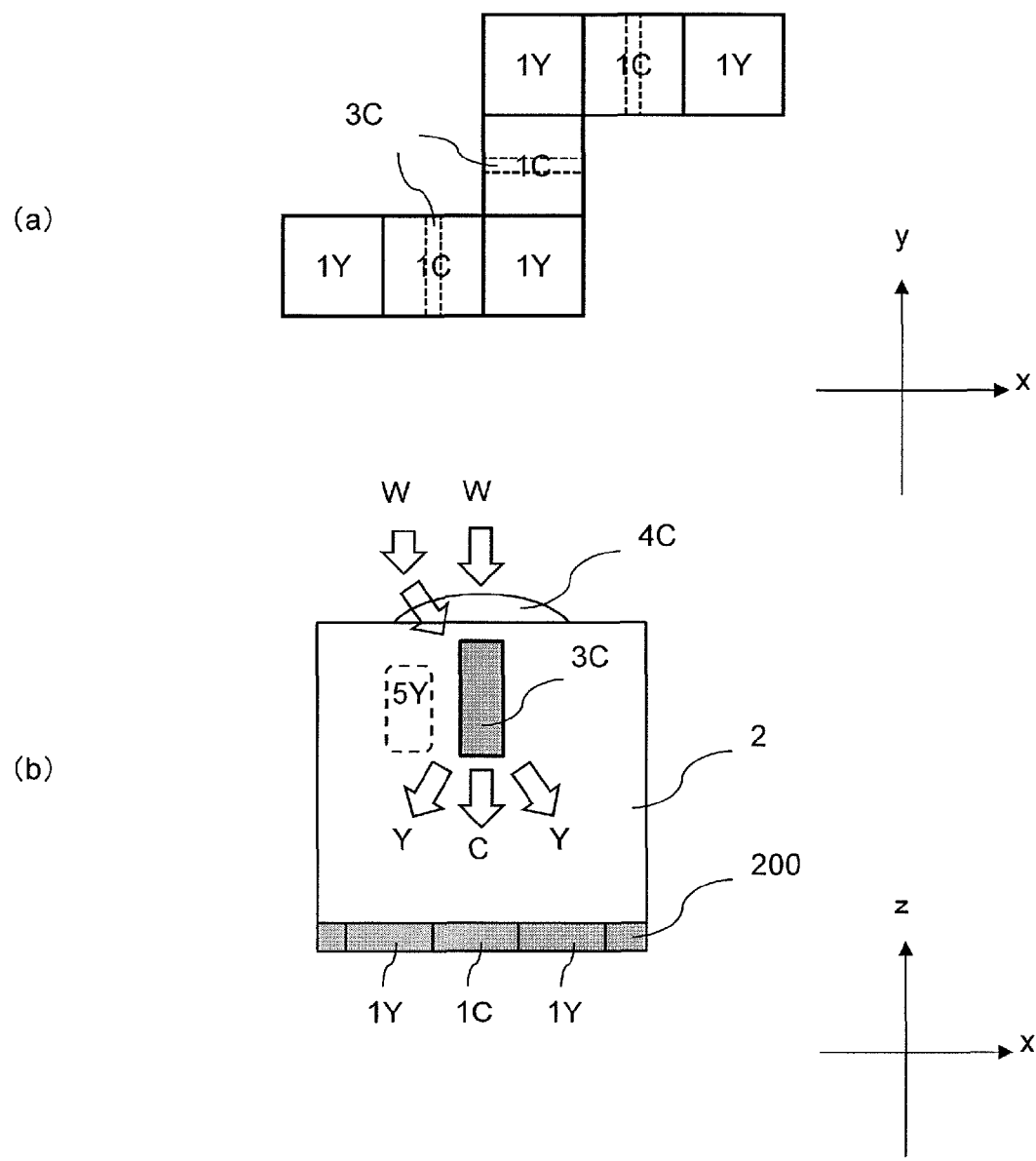
[FIG. 14 ] (a) is a plan view illustrating a portion of the photosensitive cell array 200 in which the photosensitive cells 1C and 1Y are arranged alternately and diagonally, and (b) is a schematic representation illustrating a cross-sectional structure of a single dispersing element 3C facing that portion.

FIG. 13(a) is a plan view illustrating a portion of the photosensitive cell array 200 in which the photosensitive cells 1M and 1G are arranged alternately and diagonally. FIG. 13(b) is a schematic representation illustrating a cross-sectional structure of a single dispersing element 3G facing that portion. On the other hand, FIG. 14(a) is a plan view illustrating a portion of the photosensitive cell array 200 in which the photosensitive cells 1C and 1Y are arranged alternately and diagonally. FIG. 14(b) is a schematic representation illustrating a cross-sectional structure of a single dispersing element 3C facing that portion.

As shown in FIGS. 13(b) and 14(b), the high-refractive-index transparent portions 3 that form the respective dispersing elements 3G and 3C are arranged diagonally on the xy plane so as to alternately cross each other at right angles, and their lower end is spaced apart from the photosensitive cell array 200. The low-refractive-index transparent layer 2 fills the gap between each high-refractive-index transparent portion 3 and the photosensitive cell array 200 and the gap between the respective high-refractive-index transparent portions 3. The dispersing elements 3G and 3C may be made of SiN (silicon nitride), for example, and the low-refractive-index transparent layer 2 may be made of $SiO_2$ (silicon dioxide), for example. However, this is just an example and the dispersing element array 100 may also be made of any other combination of materials. Optionally, to make a correction on the light-splitting property, a substance which absorbs light falling within a particular wavelength range may be added to a part of the high-refractive-index transparent portion or low-refractive-index transparent layer 2 that forms the dispersing elements 3G and 3C.

On the upper surface of the low-refractive-index transparent layer 2, arranged are a plurality of micro lenses 4G, 4C, each of which condenses the light onto an associated one of the dispersing elements 3G and 3C, as shown in FIGS. 13(b) and 14(b). And those micro lenses 4G and 4C form a micro lens array. In other words, the micro lens array is comprised of a first micro lens 4G which condenses light onto the first dispersing element 3G and a second micro lens 4C which condenses light onto the second dispersing element 3C.

Figure 15:
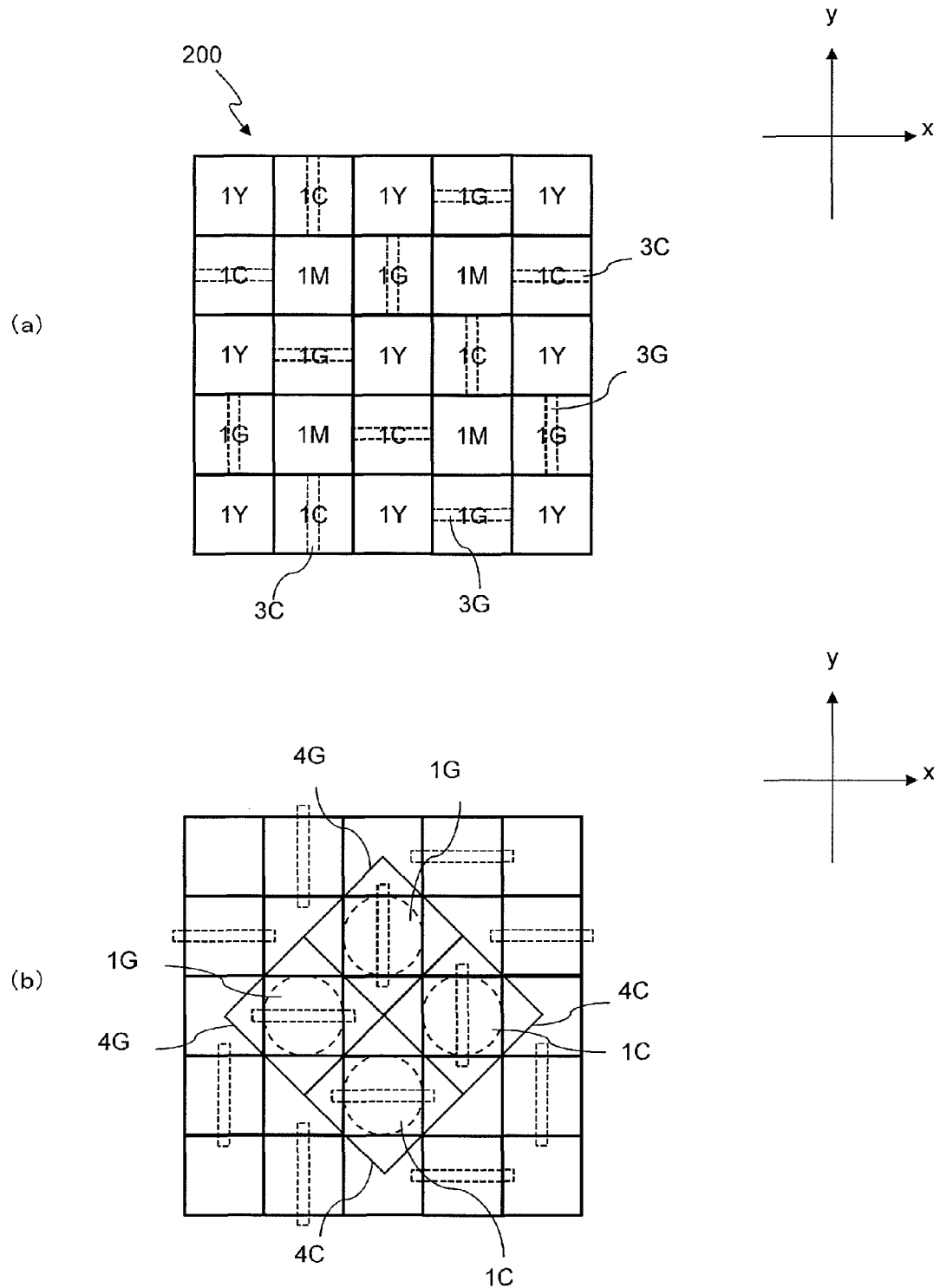
[FIG. 15 ] (a) is a plan view illustrating an exemplary arrangement of the photosensitive cells 1G, 1M, 1C and 1Y in the photosensitive cell array 200, and (b) is a plan view illustrating an exemplary arrangement of the micro lenses 4G and 4C.

FIG. 15(a) is a plan view illustrating an exemplary arrangement of the photosensitive cells 1G, 1M, 1C and 1Y in the photosensitive cell array 200, and FIG. 15(b) is a plan view illustrating an exemplary arrangement of the micro lenses 4G and 4C. As shown in FIG. 15(a), the dispersing elements 3G and 3C are arranged so as to be white or black elements of a checkerboard pattern. That is to say, the dispersing elements 3G and 3C are arranged so as to face the photosensitive cells 1G and 1C and no dispersing elements are arranged over the photosensitive cells 1M and 1Y. On the other hand, the micro lenses 4G and 4C are arranged so as to face the dispersing elements 3G and 3C as shown in FIG. 15(b). More specifically, each of the micro lenses 4G is arranged so as to cover not only its associated photosensitive cell 1G but also portions of the photosensitive cells 1M and 1Y surrounding the photosensitive cell 1G. That is why this micro lens 4G can collect parts of the light that would be incident on the photosensitive cells 1M and 1Y, were it not for the micro lens 4G, and can get the collected light split by the dispersing element 3G. In the same way, each of the micro lenses 4C is arranged so as to cover not only its associated photosensitive cell 1C but also portions of the photosensitive cells 1M and 1Y surrounding the photosensitive cell 1C. That is why this micro lens 4C can collect parts of the light that would be incident on the photosensitive cells 1M and 1Y, were it not for the micro lens 4C, and can get the collected light split by the dispersing element 3C.

Only two kinds of micro lenses 4G and 4C form the micro lens array for use in this embodiment. As shown in FIG. 15(b), each of the micro lenses 4G and 4C exceeds the area of its associated photosensitive cell 1G or 1C on the xy plane. A cross section of the micro lens 4G, 4C as viewed on a plane which is parallel to the xy plane typically has a circular shape. However, the boundary between the micro lenses 4G and 4C may be located on the diagonal of the photosensitive cell 1M, 1Y. For example, if the photosensitive cells (or pixels) have a square shape, the shape of the area covered with each micro lens 4G, 4C corresponds to the shape to be obtained by increasing the size of its associated photosensitive cell 1G, 1C by a factor of $\sqrt{2}$ without shifting its center position and rotating it 45 degrees around the center position.

Now, take a look at FIG. 13(b) again. In an exemplary configuration of this embodiment, the light ray incident on each photosensitive cell 1M has been once condensed by the dispersing element 3G which is located over the adjacent photosensitive cell 1G through the micro lens 4G that covers the photosensitive cell 1M and then split by the dispersing element 3G. The dispersing element 3G selectively diffracts a light ray with a wavelength falling within the color magenta range (±first-order diffracted light rays), which forms part of the incoming white light that has entered the micro lens 4G, transmits the rest of the incoming light (i.e., a light ray with a wavelength falling within the color green range) to produce a zero-order diffracted light ray, and then makes those light rays incident on the photosensitive cells 1M and 1G, respectively. Consequently, diffracted light rays falling within the color magenta wavelength range are incident on each photosensitive cell 1M from two dispersing elements 3G which are adjacent to the photosensitive cell 1M in the x- and y-axis directions, respectively.

Now, take a look at FIG. 14(b) again. The light ray incident on each photosensitive cell 1Y has been once condensed by the dispersing element 3C which is located over the adjacent photosensitive cell 1C through the micro lens 4C that covers the photosensitive cell 1Y and then split by the dispersing element 3C. The dispersing element 3C selectively diffracts a light ray with a wavelength falling within the color yellow range (±first-order diffracted light rays), which forms part of the incoming white light that has entered the micro lens 4C, transmits the rest of the incoming light (i.e., a light ray with a wavelength falling within the color cyan range) to produce a zero-order diffracted light ray, and then makes those light rays incident on the photosensitive cells 1Y and 1C, respectively. Consequently, diffracted light rays falling within the color yellow wavelength range are incident on each photosensitive cell 1Y from two dispersing elements 3C which are adjacent to the photosensitive cell 1Y in the x- and y-axis directions, respectively.

If a light ray has been incident on a region which is located right over a photosensitive cell 1M, 1Y, the light ray is directed toward the dispersing element 3G, 3C by the micro lens 4G, 4C. Furthermore, since the dispersing element 3G, 3C having a higher refractive index than the surrounding portion also functions as a waveguide that guides the incoming light, there will be no light (or optical path) in the region 5M, 5Y which is located beside the dispersing element 3G, 3C and right over the photosensitive cell 1M, 1Y. That is why neither the region 5M located right over the photosensitive cell 1M nor the region 5Y located right over the photosensitive cell 1Y passes the incoming light. If there is a gap between the micro lenses 4G or between the micro lenses 4C, the incoming light will pass through the gap and be incident on the upper surface of the low-refractive-index transparent layer 2 at a point right over the photosensitive cell 1M or 1Y. However, such light will also be guided and split appropriately by the dispersing element 3G, 3C.

In such a configuration, each high-refractive-index transparent portion 3 may have a size which is longer than the size of its associated photosensitive cell as measured in the x- or y-axis direction. That is to say, each high-refractive-index transparent portion 3 may be arranged so that its end portion partially overlaps with a photosensitive cell which is adjacent to its associated photosensitive cell in the longitudinal direction.

Figure 16:
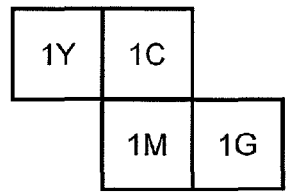
[FIG. 16 ] (a) through (h) are plan views illustrating exemplary sets of four photosensitive cells which are adjacent to each other in the photosensitive cell array of this embodiment, and (i) is a plan view indicating the center positions of those sets of four photosensitive cells.
Figure 16:
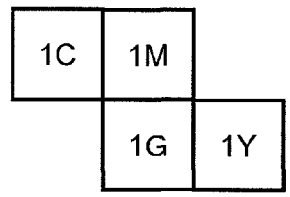
Figure 16:
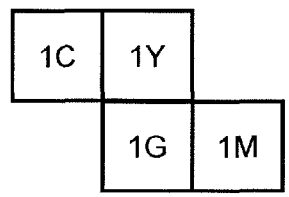
Figure 16:
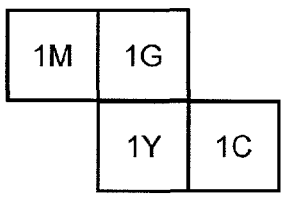
Figure 16:
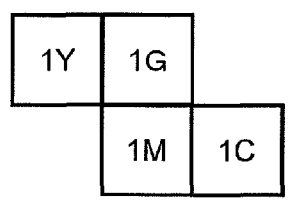
Figure 16:
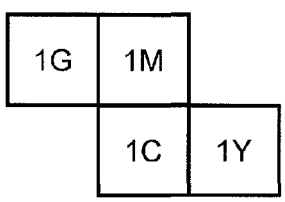
Figure 16:
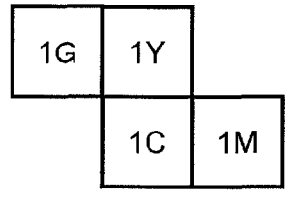
Figure 16:
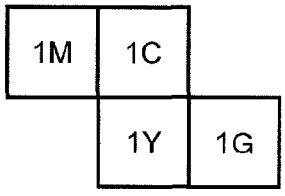
Figure 16:
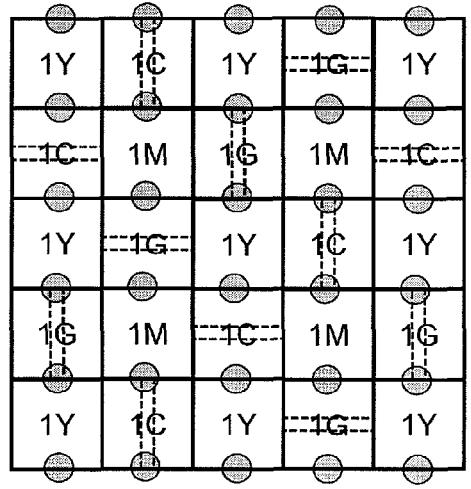

FIG. 16 shows plan views illustrating exemplary arrangements of four adjacent photosensitive cells in the photosensitive cell array of this embodiment. Each set of these four photosensitive cells includes cells in the four colors of G, M, Y and C. That is why no matter which of these sets is chosen, a single color can be reproduced by those cells in the four colors of G, M, Y and C. Those G, M, Y and C cells may be arranged in various patterns. There are eight different kinds of arrangement patterns as shown in FIGS. 16(a) to 16(h). In FIG. 16(i), the respective center positions of those sets of four-color cells to be selected arbitrarily are indicated by the open circles ○.

Figure 17:
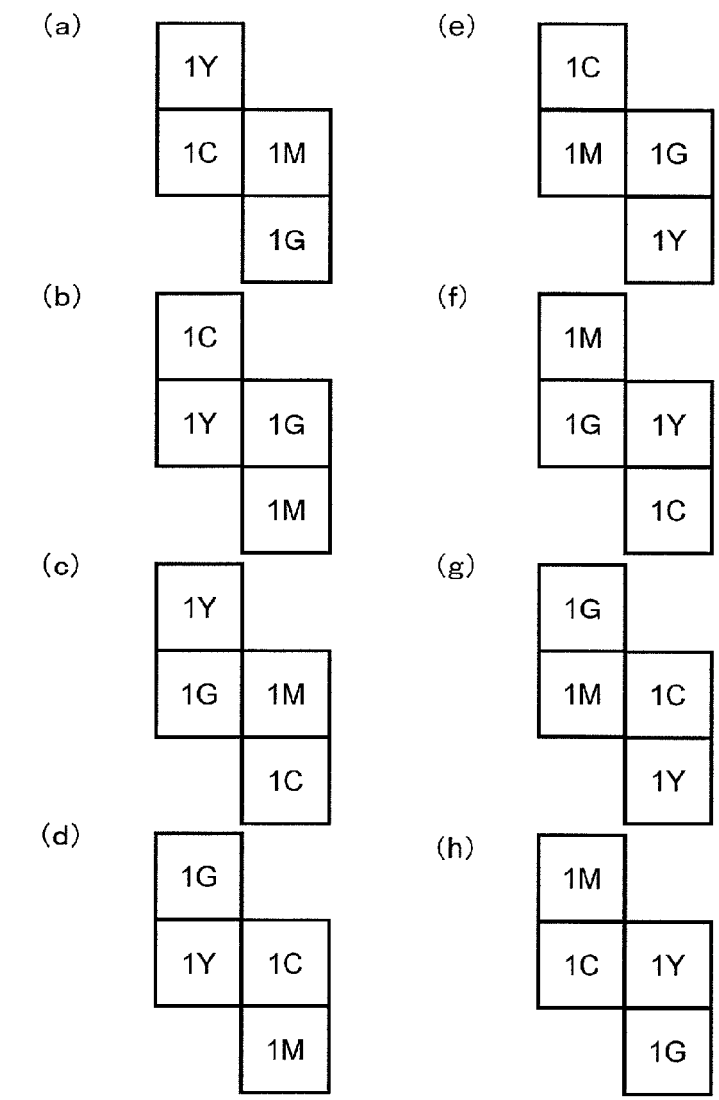
[FIG. 17] (a) through (h) are plan views illustrating other exemplary sets of four photosensitive cells which are adjacent to each other in the photosensitive cell array of this embodiment, and (i) is a plan view indicating the center positions of those sets of four photosensitive cells.

FIG. 17 shows plan views illustrating other exemplary arrangements of four adjacent photosensitive cells in the photosensitive cell array of this embodiment. In this example, each set of these four photosensitive cells also includes cells in the four colors of G, M, Y and C. That is why no matter which of these sets is chosen, a single color can be reproduced by those cells in the four colors of G, M, Y and C as in the combinations shown in FIG. 16. Those G, M, Y and C cells may be arranged in eight different kinds of patterns as shown in FIGS. 17(a) to 17(h). In FIG. 17(i), the respective center positions of those sets of four-color cells are indicated by the open circles ○. As these center positions are different from the ones shown in FIG. 16(i), the density will be doubled if these two sets of center positions are combined together.

Figure 18:
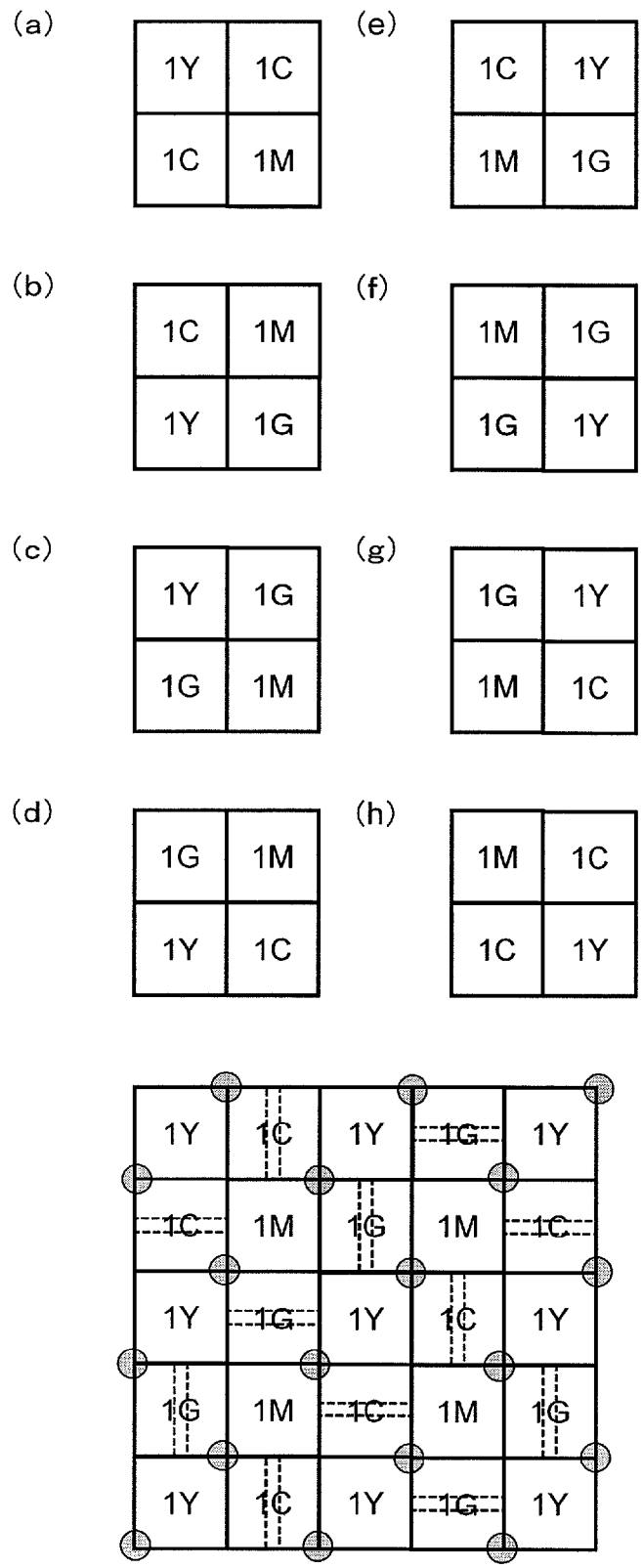
[FIG. 18] (a) through (h) are plan views illustrating still other exemplary sets of four photosensitive cells which are adjacent to each other in the photosensitive cell array of this embodiment, and (i) is a plan view indicating the center positions of those sets of four photosensitive cells.

FIG. 18 shows plan views illustrating still other exemplary arrangements of four adjacent photosensitive cells in the photosensitive cell array of this embodiment. In this example, cells in the four colors of G, M, Y and C are included in each of the sets shown in FIGS. 18(b), 18(d), 18(e) and 18(g), but cells in the three colors of M, Y, C and C are included in each of the sets shown in FIGS. 18(a) and 18(h) and cells in the three colors of M, Y, G and G are included in each of the sets shown in FIGS. 18(c) and 18(f). As will be described later, in these combinations of three-color cells, two C or G cells in the same color can have their differential image used to make a color correction when the image has an out-of-focus blur. In FIG. 18(i), the respective center positions of those sets of four-color cells are indicated by the open circles ○. The density of the center positions of these four-color cell arrangements is a half as high as in the example illustrated in FIG. 16. As these center positions shown in FIG. 18 are different from the ones shown in FIG. 16 or 17, the density will increase 2.5 times if these two sets of center positions are combined together.

Consequently, according to this embodiment, an optical efficiency which is higher than, and a resolution which is 2.5 times as high as, what is achieved by a Bayer arrangement can be obtained.

Figure 19:
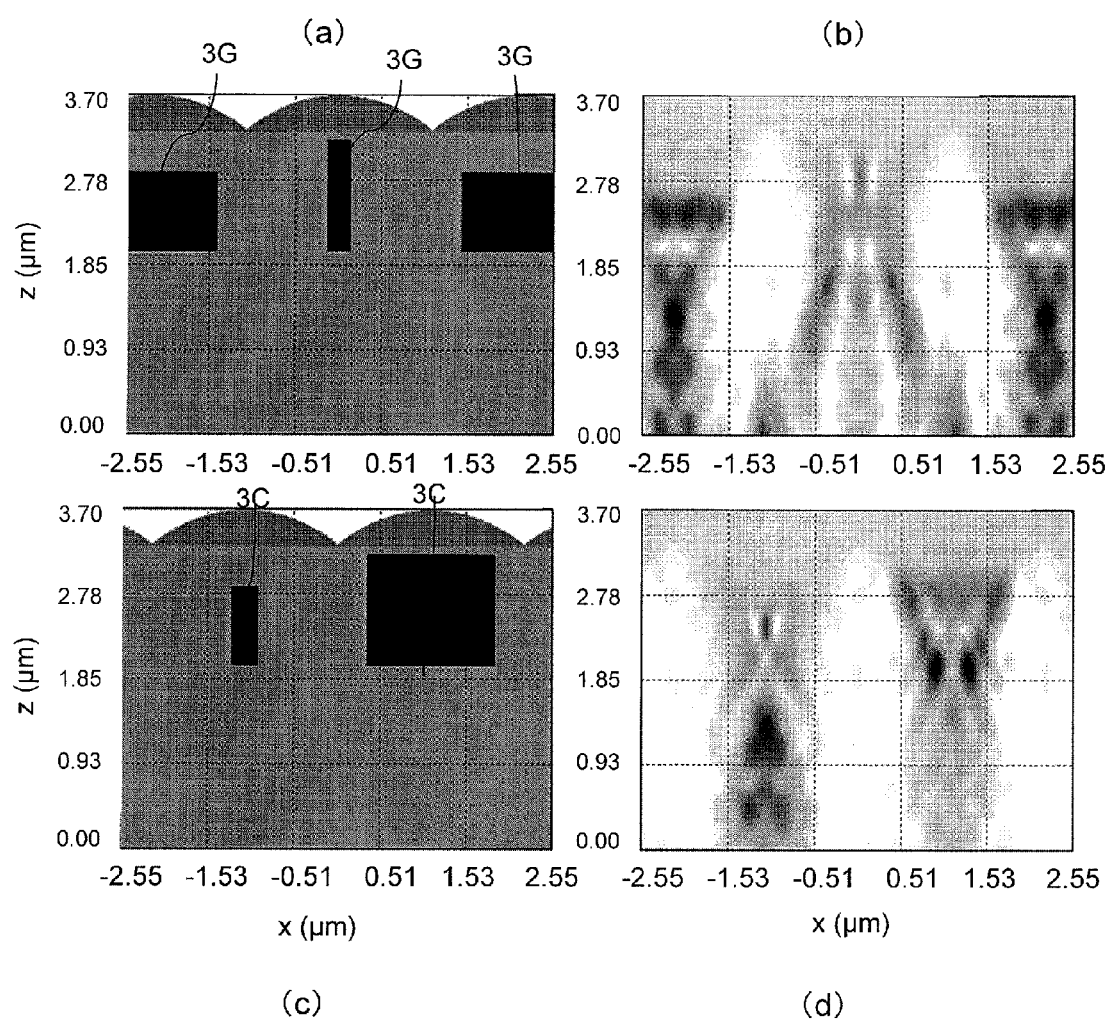
[FIGS. 19] (a) and (b) respectively show a refractive index distribution and a light intensity distribution on a cross section which passes through the center of the dispersing element 3G of this embodiment and which is parallel to the xz plane. (c) and (d) respectively show a refractive index distribution and a light intensity distribution on a cross section which passes through the center of the dispersing element 3C of this embodiment and which is parallel to the xz plane.

Next, the results of simulations that were carried out by wave motion analysis will be described with reference to FIGS. 19 and 20.

FIGS. 19(a) and 19(b) respectively show a refractive index distribution and a light intensity distribution on a cross section which passes through the center of the dispersing element 3G of this embodiment and which is parallel to the xz plane. In this example, the incoming light has a wavelength of 450 nm. In these graphs, the ordinate represents the height z (μm) as measured from the imaging area, and the abscissa is an x coordinate (in μm) which is defined with respect to the reference position as the origin. In the graph on the left-hand side, the dark regions are regions where the refractive index is set to be 2.05 and correspond to the high-refractive-index transparent portions 3 that form the dispersing elements 3G. On the other hand, the region surrounding the high-refractive-index transparent portions 3 is a region where the refractive index is set to be 1.46 and corresponds to the low-refractive-index transparent layer 2. In FIG. 19(b), the lower the lightness, the higher the light intensity. A region with a relatively high light intensity looks dark, while a region with a relatively low light intensity looks bright. As can be seen from FIGS. 19(a) and 19(b), the incoming light passes through the high-refractive-index transparent portions 3 and neighboring regions to be split into multiple light rays. And only a little light travels straight downward. As can be seen from FIG. 19(b), a region interposed between adjacent high-refractive-index transparent portions 3 looks bright and has a low light intensity.

FIGS. 19(c) and 19(d) respectively show a refractive index distribution and a light intensity distribution on a cross section which passes through the center of the dispersing element 3C of this embodiment and which is parallel to the xz plane. In this example, the incoming light has a wavelength of 450 nm. In this case, the incoming light also passes through the high-refractive-index transparent portions that form the dispersing elements 3C and neighboring regions. The dispersing elements 3C shown in FIG. 19(c) have the property of transmitting light with a wavelength of 450 nm. That is why in FIG. 19(d), the dark regions with a high light intensity (i.e., regions through which the light passes) are located right under the high-refractive-index transparent portions and the quantity of light to be split is small. It should be noted that if the wavelength of the incoming light changes from 450 nm, the dark regions shown in FIGS. 19(b) and 19(d) also change their shapes. The reason is that as the magnitude of phase shift changes with the wavelength, the wavelength distribution of split light rays changes, too.

If the incoming white light has been split by the dispersing element array shown in FIGS. 19(a) and 19(c), the light rays to be incident on associated photosensitive cells 1G, 1M, 1Y and 1C will also have the same spectra as the ones shown in FIG. 11. In this embodiment, at a wavelength of approximately 550 nm, for example, the quantity of light detected indicated by the curve Gr is also a local maximum value, and the quantity of light detected indicated by the curve Mg is a local minimum value, too. This means that if white light is incident on the dispersing element array, a light component with a center wavelength of 550 nm (i.e., the color green component) will be incident a lot on the photosensitive cell 1G and a light component representing the complementary color of the color green will be incident on the photosensitive cell 1M that is adjacent to the photosensitive cell 1G.

At a wavelength of approximately 450 nm, the quantity of light detected indicated by the curve Cy is a local maximum value, and the quantity of light detected indicated by the curve Ye is a local minimum value. This means that if white light is incident on the dispersing element array, a light component with a center wavelength of 450 nm (i.e., the color cyan component) will be incident a lot on the photosensitive cell 1C and a light component representing the complementary color of the color cyan (i.e., the color yellow component) will be incident on the photosensitive cell 1M that is adjacent to the photosensitive cell 1C.

In the solid-state image sensor of this embodiment, signals provided by respective photosensitive cells also use different pieces of color information. That is why if a 3×4 matrix with appropriately set parameters is used, RGB color signals can be calculated by performing an arithmetic operation on that matrix.

Figure 20:
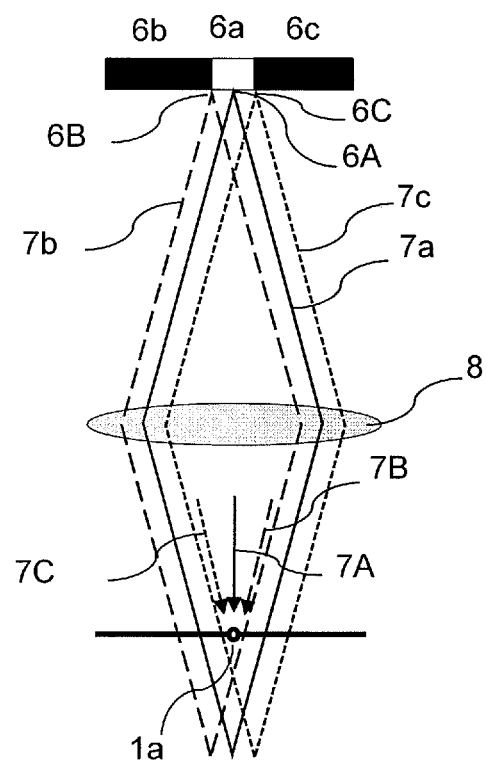
[FIG. 20] A cross-sectional view schematically illustrating the distribution of light rays on an imaging area according to this embodiment.

FIG. 20 is a cross-sectional view schematically illustrating the distribution of light rays on the imaging area according to this embodiment. In the example illustrated in FIG. 20, a blurred image has been produced on the imaging area due to defocusing. Suppose a high-luminance region 6a is interposed between two low-luminance regions 6b and 6c on the surface of a subject. In that case, the light rays 7a, 7b and 7c which have been reflected from image points 6A, 6B and 6C, respectively, on the surface of the subject are transmitted through an optical lens 8 and then incident as light rays 7A, 7B and 7C on a photosensitive cell 1a. As can be seen, if a blurred image has been produced on an imaging area, light rays which have come from the surface of a subject are incident at various angles which are equal to or smaller than the angle to be determined by the F number of an optical lens 8b. As a result, a set of those light rays form an expanded light beam spot on a photosensitive cell 1a. Consequently, if there is a steep distribution (boundary) on the surface of the subject, the distribution of brightness will be a biased one which varies according to the angle component. For example, the light ray 7A may be bright but the light rays 7B and 7C may be dark.

Figure 21:
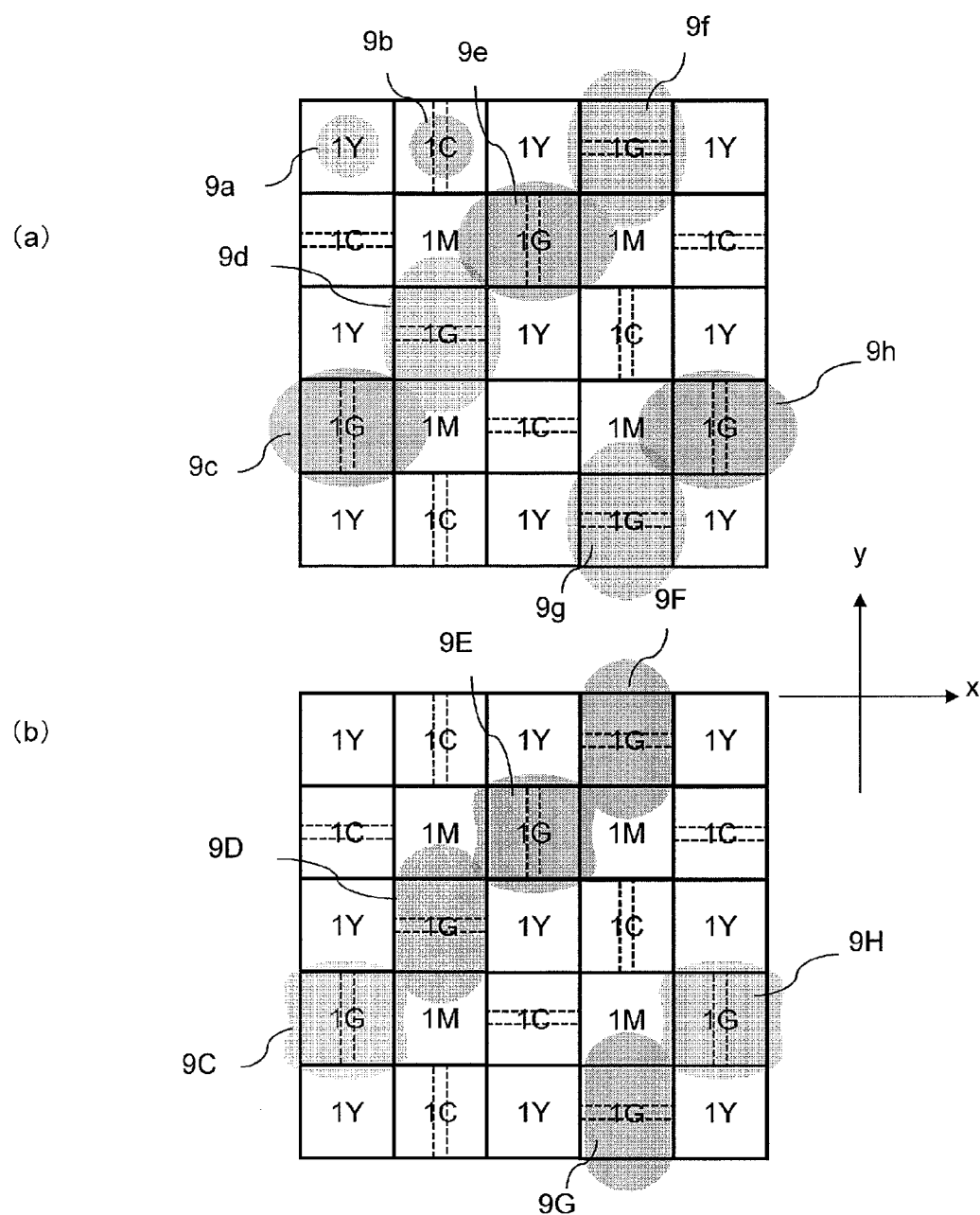
[FIGS. 21] (a) and (b) illustrate conceptually the distribution of light (light beam spots) on the imaging area according to this embodiment.

FIGS. 21(a) and 21(b) illustrate conceptually the distribution of light (i.e., light beam spots) on the imaging area. If the image is not blurred, the spots 9a and 9b shown in FIG. 21(a) expand in the x and y directions due to the influence of diffraction but still stay within their associated photosensitive cells (pixels). If a blurred image has been produced and if there are no boundaries in the luminance distribution on the surface of the subject, then the spots 9c through 9h expand symmetrically with respect to the dispersing elements as shown in FIG. 21(a). More specifically, each of those spots 9c through 9h expands and gets elongated perpendicularly to the longitudinal direction of the plate-like high-refractive-index transparent portion that forms its associated dispersing element. As a result, these spots 9c through 9h expand too much to stay within their associated photosensitive cells. Even though only spots of green rays are shown in FIG. 21, the same can be said about spots in any other color.

Although the spots 9a and 9b that are in focus can be detected independently of each other on a photosensitive cell basis, the light beam spots 9c through 9h that have expanded due to defocusing cover a plurality of surrounding photosensitive cells and have a substantially symmetrical shape with respect to their associated dispersing elements. Consequently, the light beam spots 9c through 9h affect the signals of a plurality of photosensitive cells.

If there is a boundary in the luminance distribution on the surface of a subject, each of these spots 9c through 9h has a shape in which its outer periphery has been partially notched. For example, the spots 9C through 9H shown in FIG. 21(b) come to have asymmetric shapes with respect to their associated dispersing elements. The spots get notched in various manners according to the luminance boundary direction. Also, the spots get notched to varying degrees according to the degree of defocusing and the distances from the object points 6A, 6B and 6C shown in FIG. 20 to the luminance boundary. In the example illustrated in FIG. 21(b), the spots 9C through 9H have had both of their ends notched in the x direction.

If there is no boundary in the luminance distribution on the surface of the subject, each spot will overexpand to cover adjacent photosensitive cells at a constant percentage. That is why it is possible to predict a variation in the balance of a light detection signal and make a color correction according to the variation. For example, each of the spots 9c through 9h shown in FIG. 21(a) has overexpanded to cover photosensitive cells 1M which are located on the right- and left-hand sides of (or over and under) its associated photosensitive cell 1G in the same way. Likewise, each of the spots 9c through 9h shown in FIG. 21(a) has also overexpanded to cover photosensitive cells 1Y which are located over and under (or on the right- and left-hand sides of) its associated photosensitive cell 1G in the same way, too. As can be seen, each spot will overexpand to partially cover, at a constant percentage, photosensitive cells 1M, 1Y surrounding its associated photosensitive cell 1G. As a result, a variation in the balance of the light detection signal can be predicted.

If there is a boundary in the intensity distribution on the surface of the subject, the variation in the percentage of coverage of adjacent photosensitive cells due to the overexpansion decreases to a half compared to the comparative example to be described later. Also, that variation arises uniformly irrespective of the location of the photosensitive cell. For example, if the spots 9C to 9H shown in FIG. 21(b) are compared to the spots 9c to 9h shown in FIG. 21(a), the overexpansion from the photosensitive cell 1G toward the photosensitive cells 1M does vary in the x direction but hardly varies in the y direction, and the magnitude of the overall variation has decreased to a half. In the same way, the overexpansion from the photosensitive cell 1G toward the photosensitive cells 1Y does vary in the x direction but hardly varies in the y direction, and the magnitude of the overall variation has decreased to a half. Consequently, the percentage of the overexpansion from the photosensitive cell 1G toward the photosensitive cells 1M and 1Y can be regarded as constant. That is why by predicting the variation in balance between the light detection signals to a certain degree, a color correction can be made.

On the other hand, although one of the spots 9c and 9d shown in FIG. 21(a) has an orientation that has rotated 90 degrees from the other, the quantities of light to be detected by their associated photosensitive cells 1G which are diagonally adjacent to each other are equal to each other. As for the spots 9C and 9D shown in FIG. 21(b), on the other hand, there will be a difference in the quantity of light detected between their associated photosensitive cells 1G. This difference increases proportionally to the degree to which the light beam spot is notched (i.e., the magnitude of the out-of-focus blur), and therefore, can be used to measure the magnitude of the out-of-focus blur. The same can be said about each pair of photosensitive cells 1C which are diagonally adjacent to each other. If the magnitude of the out-of-focus blur can be measured, the variation in balance between the light detection signals can be calculated inversely and a color correction can be made, too. For example, if the difference in the quantity of light detected between two photosensitive cells 1G which are located at diagonal positions on a 2×2 matrix is supposed to be δ, a value obtained by subtracting a quantity which is proportional to δ from the quantity of light detected by each of the photosensitive cells 1M and 1Y that form a 2×2 matrix and the two photosensitive cells 1G and by multiplying the remainder by a certain coefficient becomes a corrected quantity of light detected. Meanwhile, if the difference in the quantity of light detected between two photosensitive cells 1C which are located at diagonal positions on a 2×2 matrix is supposed to be Δ, a value obtained by subtracting a quantity which is proportional to Δ from the quantity of light detected by each of the photosensitive cells 1M and 1Y that form a 2×2 matrix and the two photosensitive cells 1C and by multiplying the remainder by a certain coefficient becomes a corrected quantity of light detected. As can be seen, according to this embodiment, the problem that a portion with a boundary in its luminance distribution looks colored can be overcome.

Figure 22:
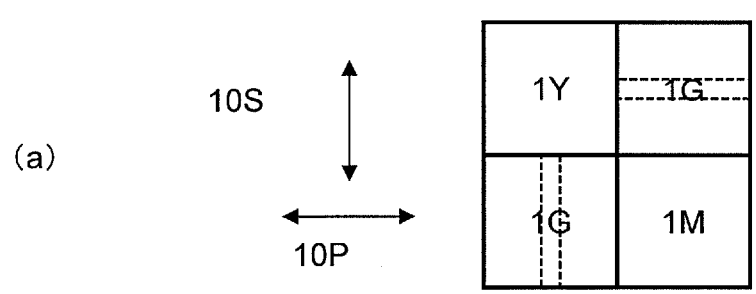
[FIG. 22] (a) is a plan view showing a relation between the polarization direction of an incoming light ray and the direction of a dispersing element according to this embodiment, and (b) is a plan view showing a relation between the polarization direction of an incoming light ray and the direction of a dispersing element according to a comparative example.
Figure 22:
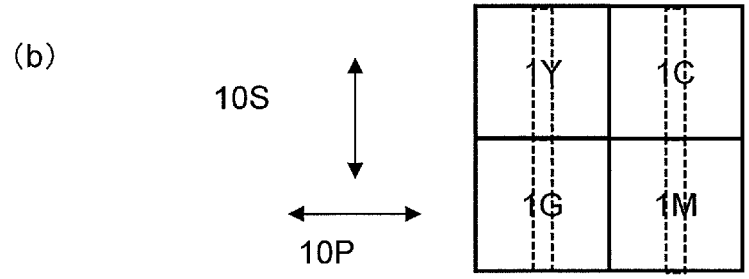

FIG. 22(a) shows a relation between the polarization direction of an incoming light ray and the direction of a dispersing element according to this embodiment. There are two independent polarization directions (of a P wave 1op and an S wave 10S) in an incoming light ray, and every light ray is represented as a combination of these two light rays. In this embodiment, no matter whether the polarization direction of the incoming light ray is that of the P wave 10P or that of the S wave 10S, there is always a dispersing element which intersects with one of these two waves at right angles. That is why even if an incoming light ray has propagated through one dispersing element in the TM waveguide mode, the incoming light ray propagates through its adjacent dispersing element in the TE waveguide mode. In the photosensitive cells 1M and 1Y, in particular, no matter what polarization direction the incoming light has, a diffracted light ray that has been split in the TM mode and a diffracted light ray that has been split in the TE mode are detected in combination. That is why these photosensitive cells 1M and 1Y are not easily affected by the polarization state of the incoming light. Meanwhile, even in the photosensitive cells 1G (or 1C), if those photosensitive cells 1G (or 1C) are located at diagonal positions in a 2×2 matrix, their propagation modes are different from each other. However, by averaging their quantities of light detected, those photosensitive cells 1G (or 1C) will be affected by the polarization states less easily.

FIG. 22(b) shows a relation between the polarization direction of an incoming light ray and the direction of a dispersing element in a comparative example to be described later. In that comparative example, the plate-like high-refractive-index transparent portions (as indicated by the dotted lines in FIG. 22(b)) that form the dispersing elements are parallel to each other. Also, in that comparative example, the dispersing elements are arranged so as to intersect with the P wave 10P at right angles and the P-wave incoming light ray propagates in the TM waveguide mode through the dispersing elements. On the other hand, the S-wave incoming light ray propagates in the TE waveguide mode through the dispersing elements. Since the light-splitting phenomenon produced by the dispersing elements is affected by the waveguide mode, the light-splitting property varies according to the polarization state of the incoming light (i.e., there is polarization dependence). Since general image capturing light is randomly polarized, there is no problem even if the light-splitting property has polarization dependence. However, a special kind of image capturing light (such as light reflected from the surface of water) has a biased polarization distribution. That is why in the comparative example, the light-splitting property varies (i.e., coloring arises), which is a problem.

Even though dispersing elements 3G which transmit a light ray with a wavelength falling within the color green range and dispersing elements 3C which transmit a light ray with a wavelength falling within the color cyan range are supposed to be used in combination in the embodiment described above, a combination of dispersing elements which split the incoming light into light rays falling within any other combination of wavelength ranges may also be used. Also, in the embodiment described above, the dispersing elements are supposed to have a plate-like cross section. However, the dispersing elements may also have a trapezoidal cross section, a barrel-shaped cross section, a peg-shaped cross section or any other appropriate shape, and may have rounded outer edges, too.

<Manufacturing Process>

Figure 23:
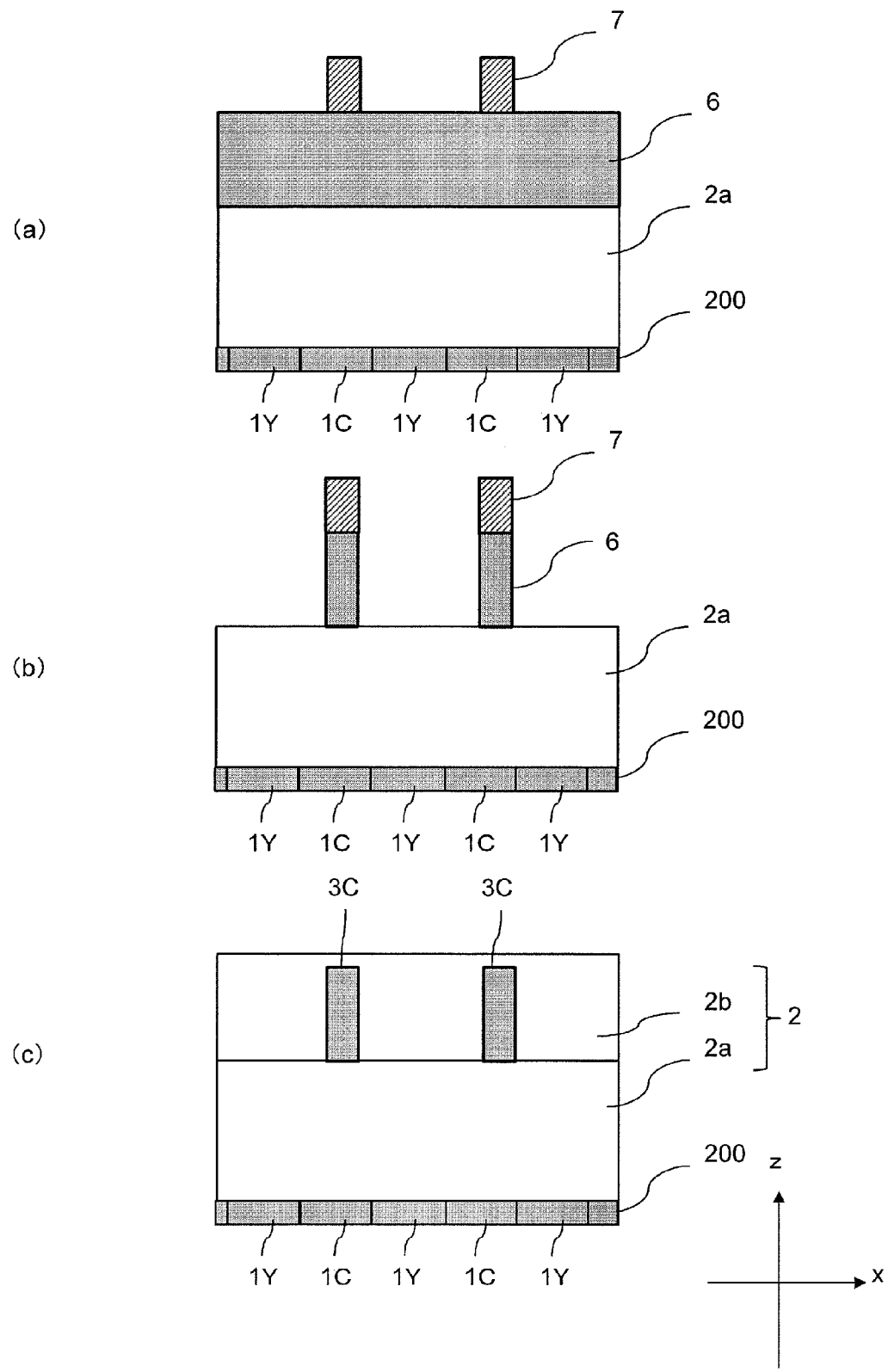
[FIG. 23] (a) to (c) are cross-sectional views illustrating respective manufacturing process steps to fabricate a dispersing element array.

Hereinafter, it will be described with reference to FIG. 23 how a dispersing element array which can be used in an embodiment of the present disclosure may be fabricated.

First of all, as shown in FIG. 23(a), a first low-refractive-index transparent layer 2a which will form part of a low-refractive-index transparent layer 2 is deposited on the photosensitive cell array 200. Such a first low-refractive-index transparent layer 6a may be deposited by a known thin film deposition technique, which may be a CVD (chemical vapor deposition) or sputtering technique, for example. Then, a transparent film 6, of which the refractive index is higher than that of the low-refractive-index transparent layer 2, is deposited on the first low-refractive-index transparent layer 2a. This transparent film 6 may also be deposited by a known thin film deposition technique. Next, an etching mask pattern 7 is defined on the transparent film 9 by photolithographic technique. If the photomask pattern is designed by photolithographic technique, an etching mask pattern 7 with an arbitrary planar shape can be formed.

Next, as shown in FIG. 23(b), by etching the transparent film 6 using the etching mask pattern 7 as a mask, unnecessary portions are removed from the transparent film 6 to form a high-refractive-index transparent portion 3 (which is the dispersing elements 3C in the example illustrated in FIG. 23(b)). This etching process may be carried out as an anisotropic dry etching process. As a result of this etching process, a taper may be formed on the side surface of the high-refractive-index transparent portions 3.

Subsequently, as shown in FIG. 23(c), after the etching mask pattern 7 has been removed, the gaps between the high-refractive-index transparent portions 3 are filled with a second low-refractive-index transparent layer 2b which will also form part of the low-refractive-index transparent layer 2, thereby finishing forming the low-refractive-index transparent layer 2. The second low-refractive-index transparent layer 2 may be formed so as to cover the upper surface of the high-refractive-index transparent portions 3.

By adjusting the thickness of the first low-refractive-index transparent layer 2a, the distance from the lower end of the high-refractive-index transparent portions 3 to the photosensitive cell array 200 can be controlled. The dispersing elements 3G and 3C which have mutually different light-splitting properties may have mutually different distances between the lower end of the high-refractive-index transparent portions 3 and the photosensitive cell array 200 as shown in FIGS. 10(a) and 10(c) or FIGS. 19(a) and 19(b). For that reason, in fabricating the dispersing element array of this embodiment, the process step of changing the thickness of the first low-refractive-index transparent layer 2a from one position to another is performed. Such a process step may be carried out either by etching some portions of the first low-refractive-index transparent layer 2a from the surface or by defining a pattern for another low-refractive-index transparent layer on the first low-refractive-index transparent layer 2a before the transparent film 6 is deposited. The pattern of that another low-refractive-index transparent layer may be defined by a lift-off process, for example.

Figure 24:
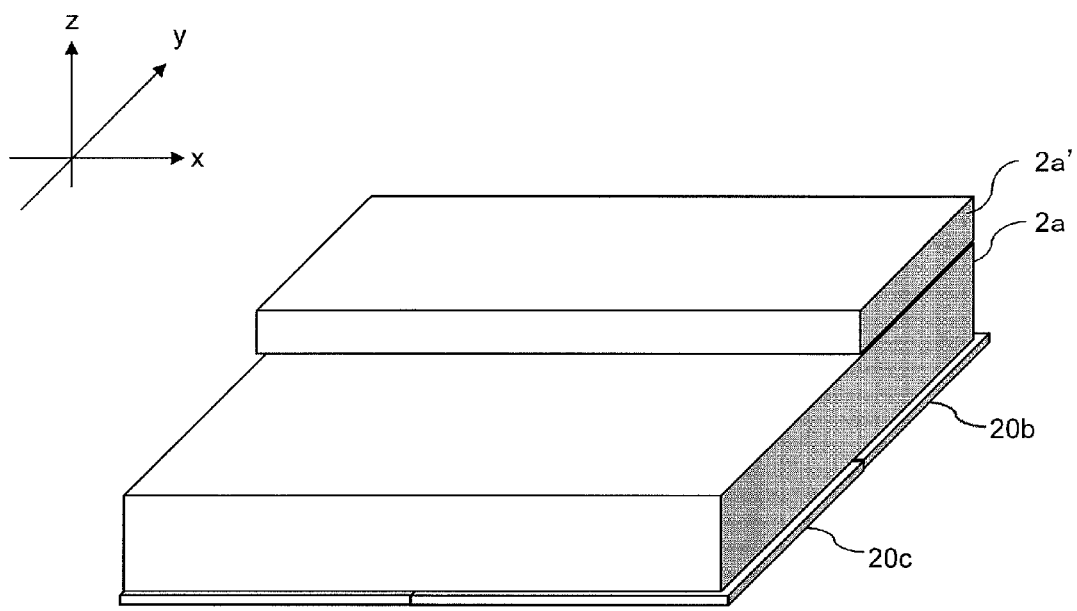
Figure 25:
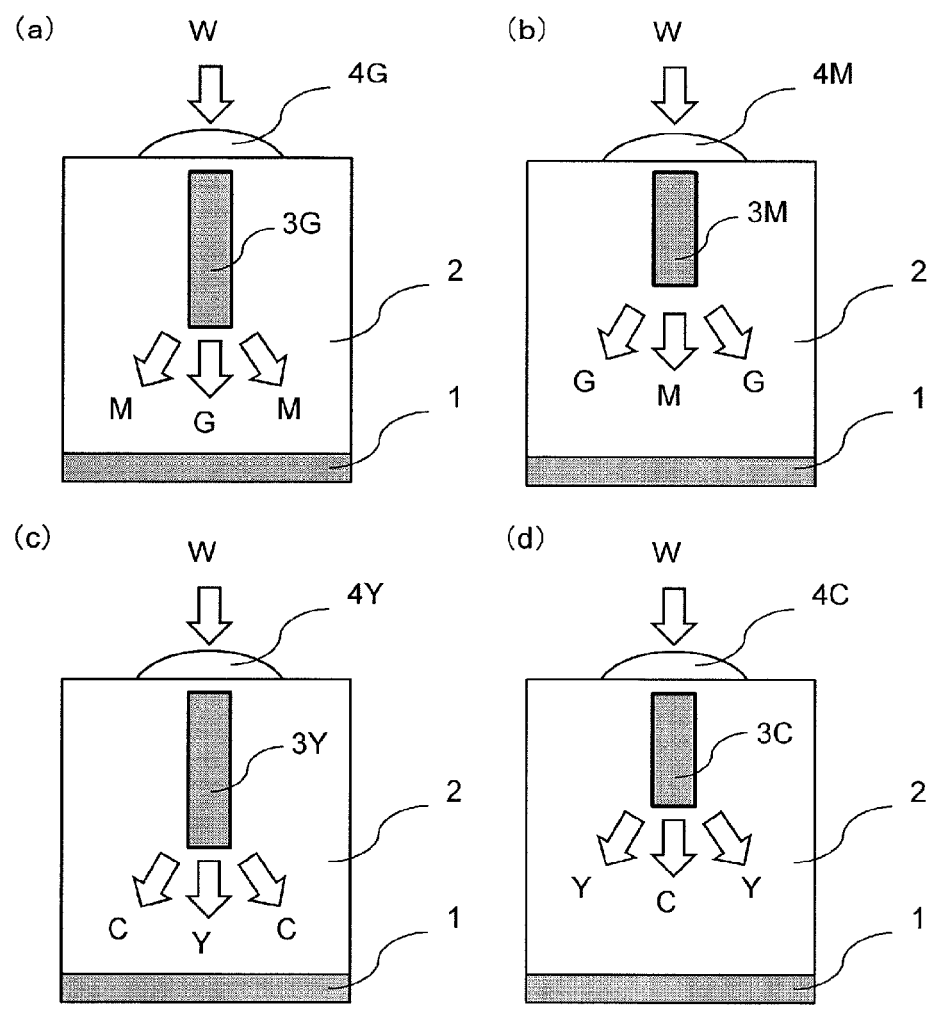
[FIG. 25] (a) to (d) schematically illustrate cross sections of the four kinds of dispersing elements for use in the comparative example.

FIG. 24 is a perspective view illustrating a portion of a structure in which a pattern for an additional low-refractive-index transparent layer 2a' has been formed on the first low-refractive-index transparent layer 2a. The additional low-refractive-index transparent layer 2a' may have a striped pattern, for example.

Furthermore, as shown in FIGS. 10(a) and 10(c) or FIGS. 19(a) and 19(b), the dispersing elements 3G and 3C with mutually different light-splitting properties have high-refractive-index transparent portions 3 with different heights (i.e., their sizes as measured in the z-axis direction are different from each other). To change the height of the high-refractive-index transparent portion 3 from one position to another, a transparent film, 6, of which the thickness varies from one position to another, may be deposited. Such a transparent film 6 may be obtained by depositing a transparent film 6 to a substantially uniform thickness over the first low-refractive-index transparent layer 2a, of which the surface has a level difference such as the one shown in FIG. 24, and then by planarizing the upper surface of the transparent film 6. If such planarization is carried out, the respective upper surfaces of the high-refractive-index transparent portions 3 that form the dispersing element array will all be level with each other. If the levels of the upper surfaces of the high-refractive-index transparent portions 3 need to be changed according to the type of the dispersing element, the upper surface of the high-refractive-index transparent portion 3 which is located in a particular area may be masked and the upper surface of the high-refractive-index transparent portion 3 which is not masked may be etched selectively.

It should be noted that the method described above is just an example and the dispersing element array does not have to be made by that method.

Comparative Example

In the embodiment described above, plate-like members are arranged in half of all pixels. Hereinafter, an exemplary configuration in which plate-like members are arranged in all pixels will be described as a comparative example. In this comparative example, the configuration of the dispersing element array is different from that of the dispersing element array of the embodiment described above. The dispersing element array of this comparative example includes four kinds of dispersing elements with mutually different light-splitting properties so that any of those dispersing elements faces each of those photosensitive cells.

FIGS. 25(a) to 25(d) schematically illustrate cross sections of the four kinds of dispersing elements for use in this comparative example. The dispersing element 3G shown in FIG. 25(a) splits the incoming light so that a green ray is incident on the photosensitive cell that is located right under the dispersing element 3G and that magenta rays are incident on adjacent photosensitive cells. Conversely, the dispersing element 3M shown in FIG. 25(b) splits the incoming light so that a magenta ray is incident on the photosensitive cell that is located right under the dispersing element 3M and that green rays are incident on adjacent photosensitive cells. On the other hand, the dispersing element 3Y shown in FIG. 25(c) splits the incoming light so that a yellow ray is incident on the photosensitive cell that is located right under the dispersing element 3Y and that cyan rays are incident on adjacent photosensitive cells. Conversely, the dispersing element 3C shown in FIG. 25(d) splits the incoming light so that a cyan ray is incident on the photosensitive cell that is located right under the dispersing element 3C and that yellow rays are incident on adjacent photosensitive cells.

Over these dispersing elements 3G, 3M, 3Y and 3C, arranged are micro lenses 4G, 4M, 4Y and 4C, respectively, which condense the incoming light onto the dispersing elements 3G, 3M, 3Y and 3C, respectively.

Figure 26:
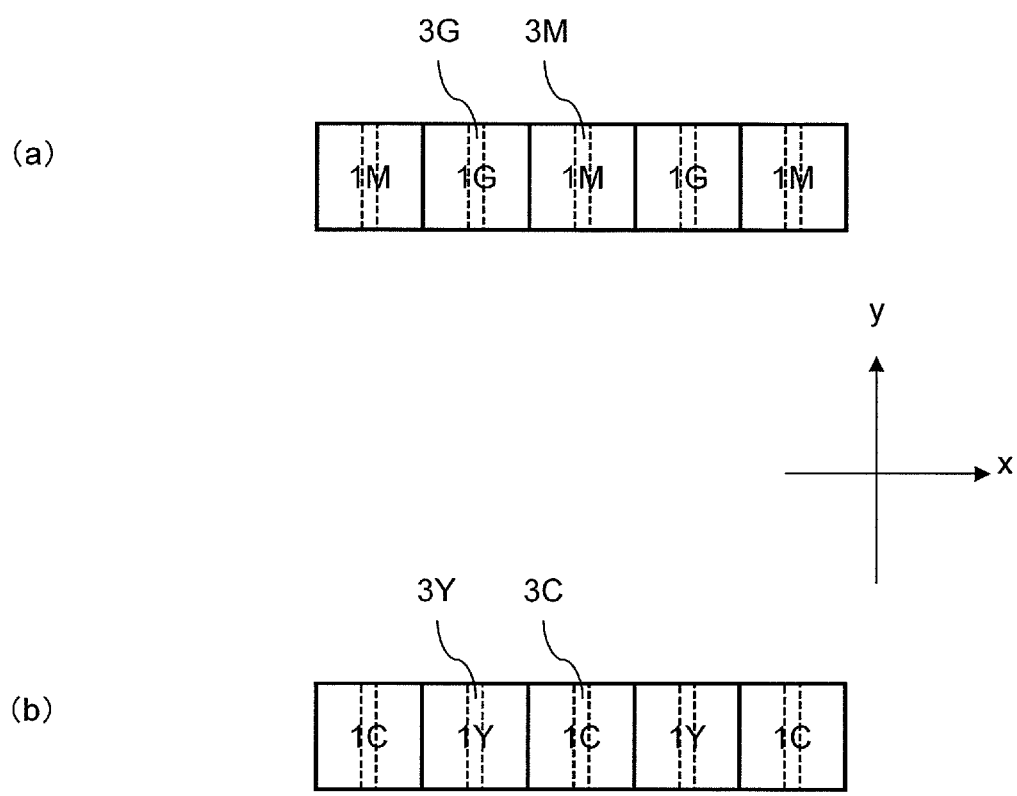
[FIG. 26] (a) illustrates a certain row of the pixel arrangement according to the comparative example, and (b) illustrates a row which is adjacent to the row shown in (a).

FIG. 26(a) illustrates a certain row of the pixel arrangement according to this comparative example. On this row, photosensitive cells 1G on which green rays are incident and photosensitive cells 1M on which magenta rays are incident are arranged alternately in the x-axis direction. FIG. 26(b) illustrates a row which is adjacent to the row shown in FIG. 26(a). On this row, photosensitive cells 1C on which cyan rays are incident and photosensitive cells 1Y on which yellow rays are incident are arranged alternately in the x-axis direction.

Figure 27:
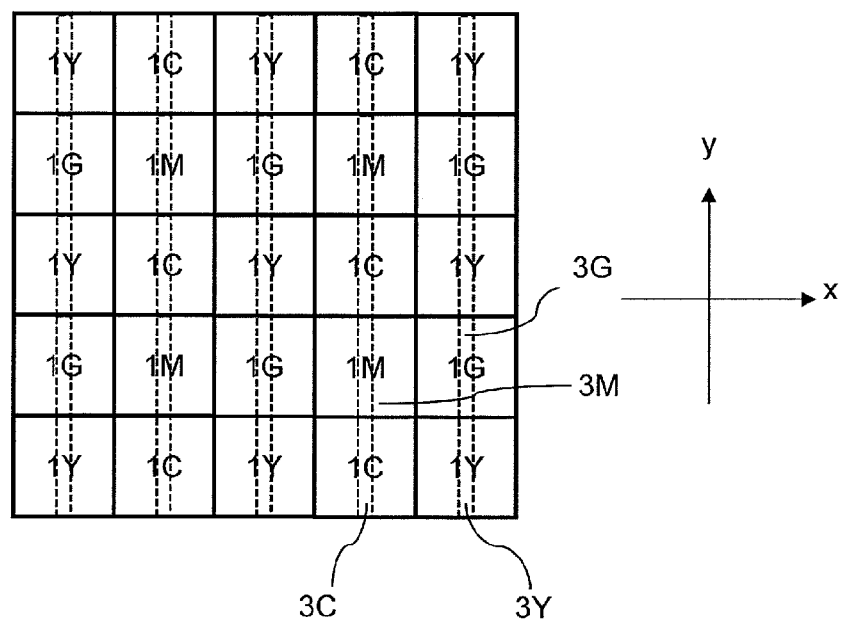
[FIG. 27] (a) illustrates a pixel arrangement according to the comparative example in which the rows each having the arrangement shown in FIG. 26(a) and rows each having the arrangement shown in FIG. 26(b) are arranged alternately in the y-axis direction, and (b) illustrates an arrangement of micro lenses 4G, 4M, 4Y and 4C.
Figure 27:
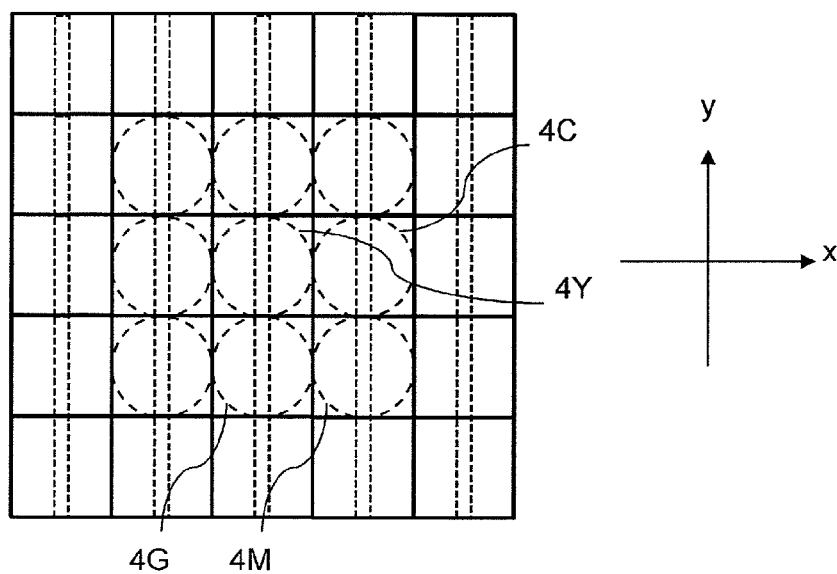

FIG. 27(a) illustrates a pixel arrangement according to this comparative example in which the rows each having the arrangement shown in FIG. 26(a) and rows each having the arrangement shown in FIG. 26(b) are arranged alternately in the y-axis direction. FIG. 27(b) illustrates an arrangement of micro lenses 4G, 4M, 4Y and 4C.

Figure 28:
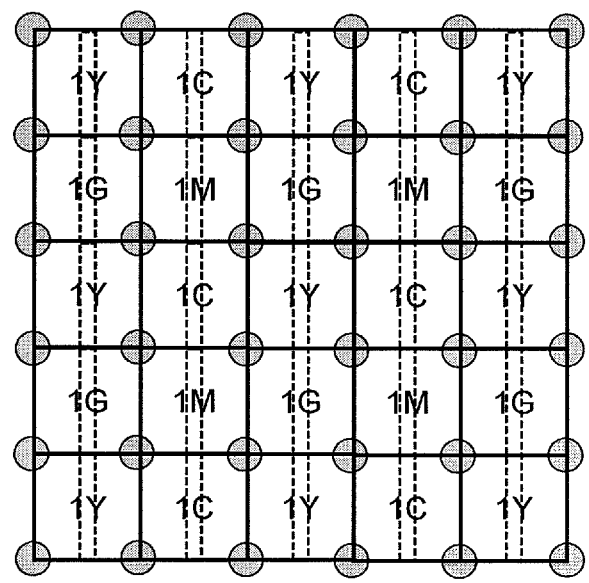
[FIG. 28] (a) through (d) are plan views illustrating other exemplary sets of four photosensitive cells which are adjacent to each other in the photosensitive cell array of the comparative example, and (e) is a plan view indicating the center positions of those sets of four photosensitive cells.

FIG. 28 illustrates plan views showing a combination of photosensitive cells according to this comparative example. As in a Bayer arrangement, no matter how cells are arranged as a set, each set always includes photosensitive cells in the four colors of G, M, Y and C to reproduce a single color.

Those photosensitive cells 1G, 1M, 1Y and 1C in the four colors may be arranged in any of the four different patterns shown in FIGS. 28(a) to 28(d). In FIG. 28(e), the center position of each set consisting of the photosensitive cells 1G, 1M, 1Y and 1C in the four colors is indicated by the open circle ◯. The density of the center positions is as high as the density in a Bayer arrangement.

Figure 29:
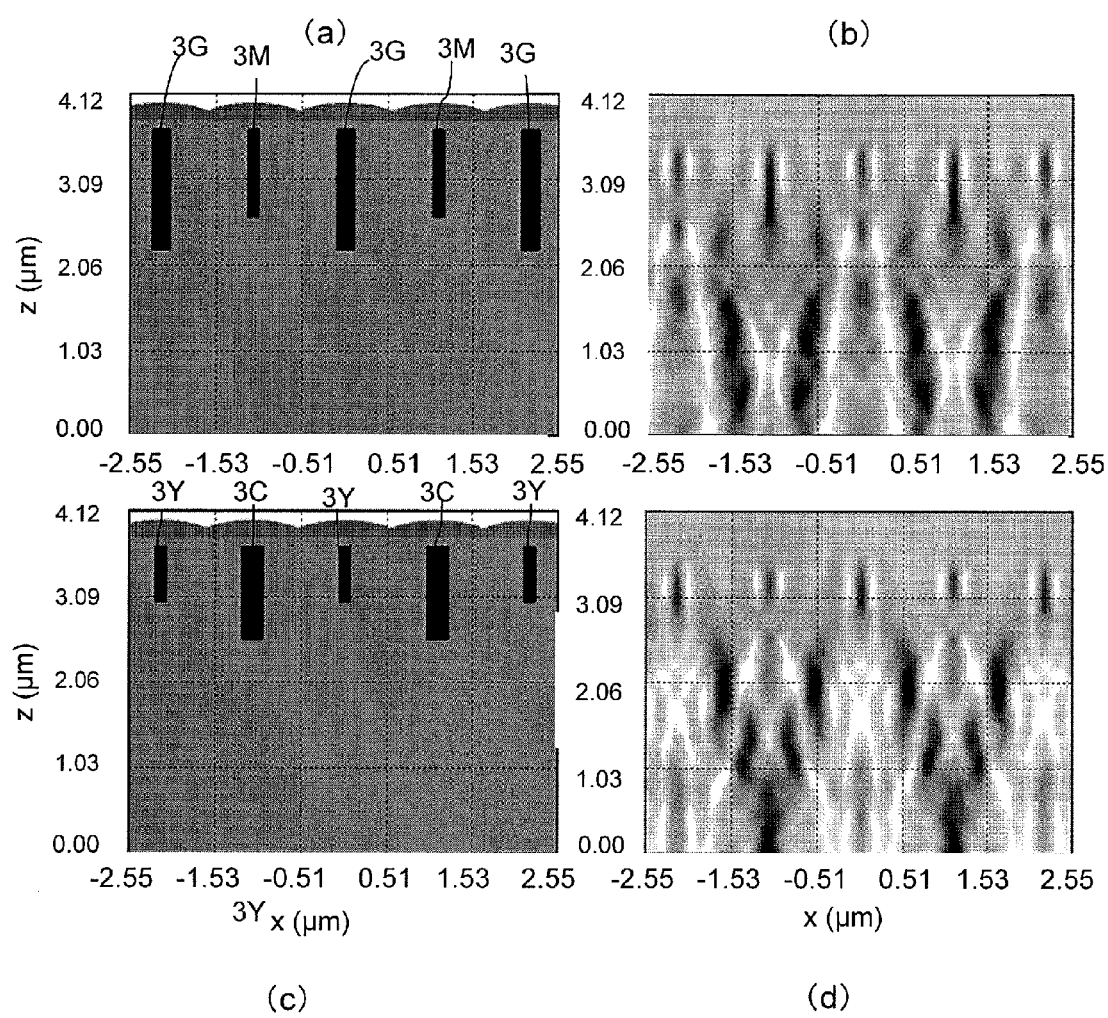
[FIGS. 29] (a) and (b) respectively show a refractive index distribution and a light intensity distribution on a cross section which passes through the center of the dispersing elements 3G, 3M of the comparative example and which is parallel to the xz plane, and (c) and (d) respectively show a refractive index distribution and a light intensity distribution on a cross section which passes through the center of the dispersing elements 3C, 3Y of this embodiment and which is parallel to the xz plane.

The present inventors carried out simulations by wave motion analysis that have already been described with reference to FIGS. 10 and 11 and 19 on this comparative example. The results are shown in FIGS. 29 and 30.

FIGS. 29(a) and 29(b) respectively show a refractive index distribution and a light intensity distribution on a cross section which passes through the center of the dispersing elements 3G, 3M of this comparative example and which is parallel to the xz plane. FIGS. 29(c) and 29(d) respectively show a refractive index distribution and a light intensity distribution on a cross section which passes through the center of the dispersing elements 3C, 3Y of this comparative example and which is parallel to the xz plane. FIG. 30 is a graph showing the spectra of the light rays to be incident on associated photosensitive cells 1G, 1M, 1Y and 1C in a situation where the incoming white light has been split by the dispersing element array shown in FIGS. 29(a) and 29(c).

In this comparative example, the four kinds of dispersing elements 3G, 3M, 3Y and 3C have mutually different heights, and therefore, need to be made by performing the etching process in four separate steps. In addition, since the four kinds of dispersing elements are densely arranged so as to cover all photosensitive cells, the entire space is filled with light (or optical paths) with no gap left at all. That is why there are no spaces left for metal lines, either.

Figure 30:
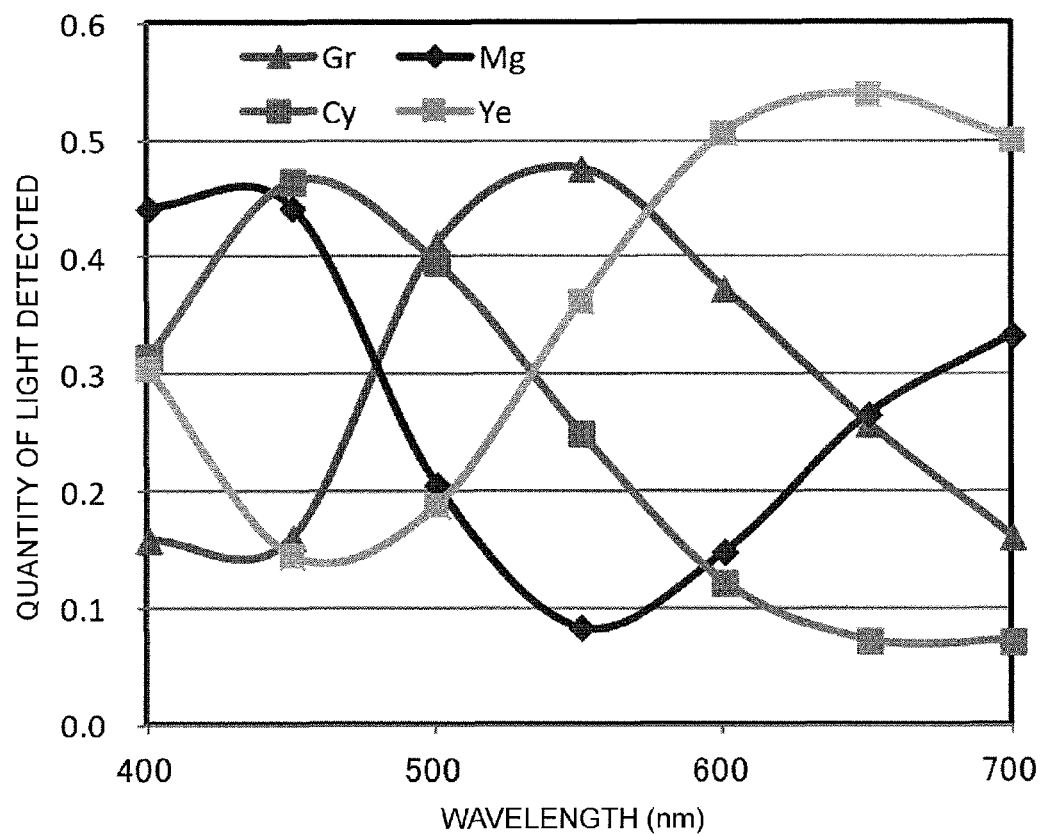
[FIG. 30] A graph showing the spectra of the light rays to be incident on associated photosensitive cells 1G, 1M, 1Y and 1C in a situation where the incoming white light has been split by the dispersing element array shown in FIGS. 29(a) and 29(c).

Comparing the embodiment of the present disclosure to this comparative example, there is no significant difference in light-splitting ability between them as can be seen from FIGS. 11 and 30. The dispersing element array 100 of this embodiment, however, includes only two kinds of dispersing elements 3G and 3C with mutually different heights as shown in FIGS. 10 and 19. That is why to make such a dispersing element array 100, the process step of depositing and patterning a film of a material with a relatively high refractive index needs to be performed just twice. In addition, in the embodiment of the present disclosure, the high-refractive-index transparent portions have a broad width and there is no light (or optical path) in a region beside the dispersing element 3G, 3C and right over the photosensitive cell 1M, 1Y. That is why a metal line can be formed in that region.

Figure 31:
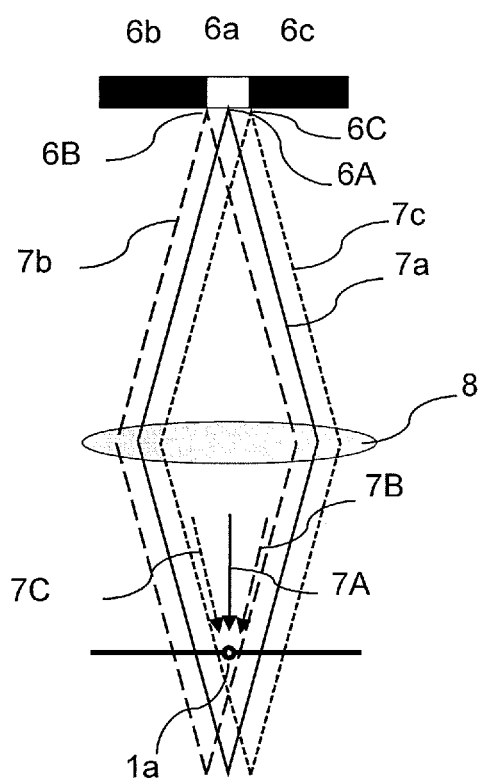
[FIG. 31] A cross-sectional view schematically illustrating the distribution of light rays on an imaging area according to the comparative example.
Figure 32:
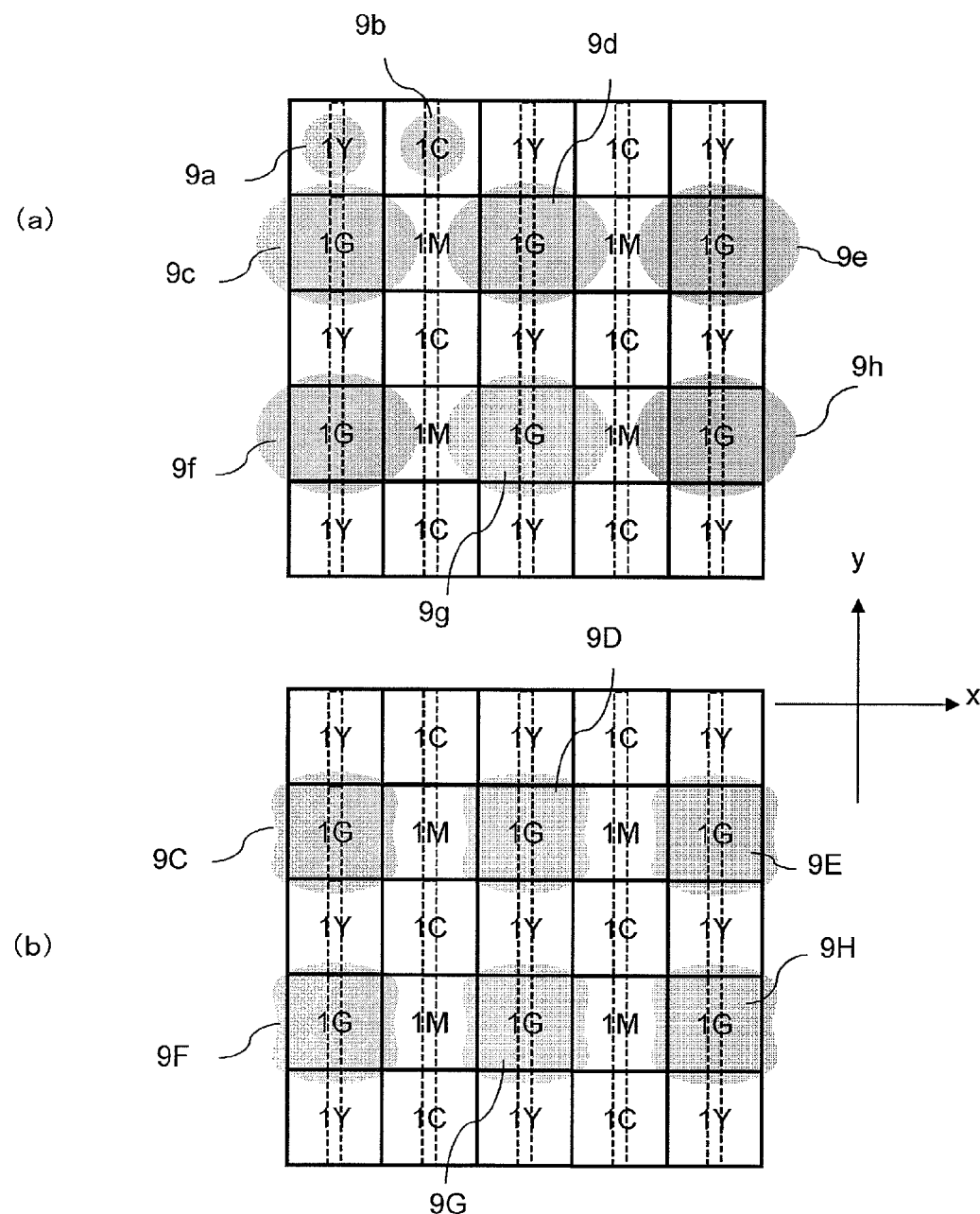
[FIGS. 32] (a) and (b) illustrate conceptually the distribution of light (light beam spots) on the imaging area according to the comparative example.

FIG. 31 is a cross-sectional view schematically illustrating the distribution of light rays on an imaging area according to this comparative example. FIGS. 32(a) and 32(b) illustrate conceptually the distribution of light (light beam spots) on the imaging area. These drawings correspond to FIGS. 20 and 21 which have already been referred to for the second embodiment of the present disclosure.

If the image is not blurred, the spots 9a and 9b shown in FIG. 32(a) expand in the x and y directions due to the influence of diffraction but still stay within their associated photosensitive cells (pixels). If a blurred image has been produced and if there are no boundaries in the luminance distribution on the surface of the subject, then the spots 9c through 9h expand symmetrically with respect to the dispersing elements as shown in FIG. 32(a). If there is a boundary in the luminance distribution on the surface of a subject, each of these spots 9c through 9h has a notched shape as already described for the embodiment. As can be seen, if there is a boundary in the luminance distribution on the surface of the subject, the percentages of the overexpansion of the spots 9c through 9h do not become constant in the x or y direction but change from one position to another on the image. That is why the variation in the balance of the light detection signal cannot be predicted and no color correction can be made, either. For example, comparing the spots 9C to 9H shown in FIG. 32(b) to the spots 9a to 9h shown in FIG. 32(a), it can be seen that the percentage of the overexpansion from the photosensitive cells 1G has decreased significantly in the photosensitive cell 1M interposed between the photosensitive cells 1G. On the other hand, in the photosensitive cell 1Y interposed between the photosensitive cells 1G, the light overexpanding from the photosensitive cells 1G hardly changes. Consequently, the percentages of the overexpansion do not become constant in the x or y direction between the photosensitive cells 1M and 1Y. As can be seen, according to this comparative example, if an image has gotten blurred due to defocusing, the color correction cannot be made in a region where there is a boundary in the luminance distribution to make that region look colored, which is a problem.

Even though dispersing elements 3G which transmit a light ray with a wavelength falling within the color green range and dispersing elements 3C which transmit a light ray with a wavelength falling within the color cyan range are supposed to be used in combination in the embodiment described above, a combination of dispersing elements which split the incoming light into light rays falling within any other combination of wavelength ranges may also be used. Also, in the embodiment described above, the high-refractive-index transparent portions of the dispersing elements are supposed to have a plate-like cross section. However, the high-refractive-index transparent portions may also have a trapezoidal cross section, a barrel-shaped cross section, a peg-shaped cross section or any other appropriate shape, and may have rounded outer edges, too.

The solid-state image sensor of the present disclosure can obtain color information by performing signal arithmetic operations using dispersing elements without using any color filters that would absorb part of the light. As a result, the loss of the light can be cut down and the image capturing sensitivity can be increased. As can be seen, according to the present disclosure, not just can the resolution be increased with the incoming light used highly efficiently but also can the manufacturing process be simplified. On top of that, plenty of space can be left for metal lines, too.

It should be noted that the photosensitive cells do not have to be arranged parallel to the x or y axis in the xy plane but may also be arranged obliquely so as to define a tilt angle with respect to the x or y axis. For example, an arrangement obtained by rotating the arrangement shown in FIG. 8 or 15 45 degrees around the z axis on the xy plane may be adopted.

<Image Capture Device>

Hereinafter, an embodiment of an image capture device according to the present disclosure will be described with reference to FIGS. 33 and 34.

Figure 33:
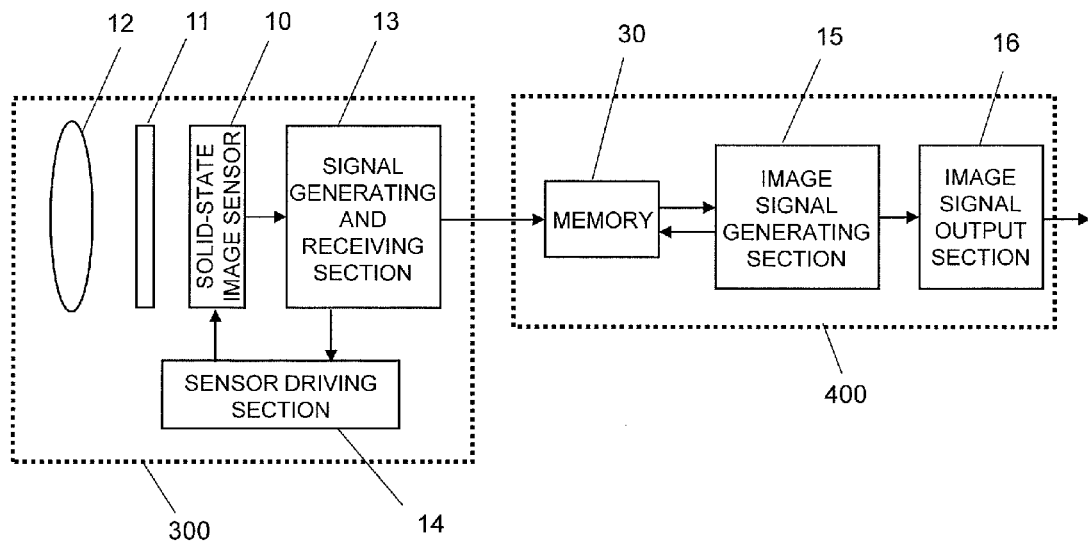
[FIG. 33] A block diagram illustrating an overall configuration for an image capture device according to an embodiment of the present invention.

FIG. 33 is a block diagram illustrating an overall configuration for an image capture device according to this embodiment. This image capture device is a digital electronic camera and includes an image capturing section 300 and a signal processing section 400 which receives a signal from the image capturing section 300 and outputs a signal representing an image (i.e., an image signal). The image capture device may either generate only a still picture or have the function of generating a moving picture.

The image capturing section 300 includes an optical lens 12 which images a given subject, an optical filter 11, and the solid-state image sensor 10 of the embodiment described above. The image capturing section 300 further includes a signal generating and receiving section 13 which not only generates a fundamental signal to drive the image sensor 10 but also receives the output signal of the image sensor 10 and sends it to the signal processing section 400 and a sensor driving section 14 which drives the image sensor 10 in accordance with the fundamental signal generated by the signal generating and receiving section 13. The optical lens 12 is a known lens and may be a lens unit including multiple lenses. The optical filter 11 may be an infrared cut filter which filters out infrared rays, for example. Optionally, quartz crystal low-pass filter which reduces a moiré pattern to be caused by a pixel arrangement may also be provided along with the optical filter 11. Or the optical filter 11 may be omitted. The image sensor 10 has either the structure that has already been described with reference to FIGS. 1 through 11 or the structure that has already been described with reference to FIGS. 12 through 22. The signal generating and receiving section 13 and the sensor driving section 14 may be implemented as an LSI such as a CCD driver.

The signal processing section 400 includes an image signal generating section 15 which generates an image signal by processing the signal supplied from the image capturing section 300, a memory 30 which stores various kinds of data that have been produced while the image signal is being generated, and an image signal output section 16 which sends out the image signal thus generated to an external device. The image signal generating section 15 is suitably a combination of a hardware component such as a known digital signal processor (DSP) and a software program for use to perform image processing involving the image signal generation. The memory 30 may be a DRAM, for example. And the memory 30 not only stores the signal supplied from the image capturing section 300 but also temporarily holds the image data that has been generated by the image signal generating section 15 or compressed image data. These image data are then output to either a storage medium or a display section (neither is shown) by way of the image signal output section 16.

The image capture device of this embodiment actually further includes an electronic shutter, a viewfinder, a power supply (or battery), a flashlight and other known components. However, description thereof will be omitted herein because none of them are essential components that would make it difficult to understand how the present invention works unless they were described in detail. It should also be noted that this configuration is just an example. Rather, this embodiment may also be carried out as any other appropriate combination of known elements as long as the solid-state image sensor 10 and the image signal generating section 15 are included.

Hereinafter, the basic configuration of the image capturing section 300 of this embodiment will be described.

Figure 34:
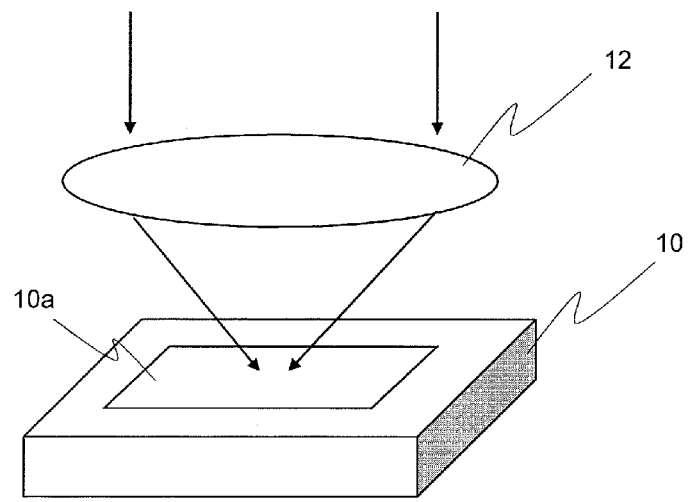
[FIG. 34] Schematically illustrates how the light that has been transmitted through the lens 12 is incident on the solid-state image sensor 10.

FIG. 34 schematically illustrates how the light that has been transmitted through the lens 12 is incident on the solid-state image sensor 10 during an exposure process. In FIG. 34, shown are only the lens 12 and the solid-state image sensor 10 with illustration of the other components omitted for the sake of simplicity. Also, although the lens 12 actually often consists of a number of lenses which are arranged in the optical axis direction, the lens 12 shown in FIG. 34 is illustrated as a single lens in a simplified form.

The image signal generating section 15 generates a color image based on the signals supplied from the solid-state image sensor 10. Specifically, pixel signals are obtained from the photosensitive cells 1G, 1M, 1Y and 1C of the solid-state image sensor 10. Those pixel signals read from the photosensitive cells 1G, 1M, 1Y and 1C include information about the quantities of colors green, magenta, yellow, and cyan components included in the incoming light. That is why by performing arithmetic operations on these pixel signals, RGB signals representing the colors red, green and blue and other signals can be obtained.

Industrial Applicability

This embodiment can be used to shoot an object image and a color image with a high resolution, in particular.

REFERENCE SIGNS LIST

1, 1G, 1M, 1Y, 1C photosensitive cell
2 low-refractive-index transparent layer
3 high-refractive-index transparent portion
3G, 3M, 3Y, 3C dispersing element
4G, 4M, 4Y, 4C micro lens
5M, 5Y region that passes no light
10 solid-state image sensor
11 optical filter
12 optical lens
13 signal generating and receiving section
14 sensor driving section
15 image signal generating section
16 image signal output section
20 photosensitive cell
20a, 20b, 20c, 20d photosensitive cell
100 dispersing element array
200 photosensitive cell array
300 image capturing section
400 signal processing section

The invention claimed is:

1. A solid-state image sensor comprising:
    a photosensitive cell array in which a plurality of unit blocks, each including first, second, third and fourth photosensitive cells, are arranged two-dimensionally on an imaging area; and
    a dispersing element array which is arranged so as to face the photosensitive cell array and which includes a plurality of high-refractive-index transparent portions and a low-refractive-index transparent layer that has a lower refractive index than the plurality of high-refractive-index transparent portions and that fills a gap between the high-refractive-index transparent portions, the dispersing element array including multiple pairs of dispersing elements which are arranged so as to face the multiple unit blocks of the photosensitive cell array,
    wherein each of the multiple pairs of dispersing elements is comprised of: a first dispersing element which includes one of the plurality of high-refractive-index transparent portions and which splits incoming light into two light rays representing first and second color components, respectively; and a second dispersing element which includes another one of the plurality of high-refractive-index transparent portions and which splits the incoming light into two light rays representing third and fourth color components, respectively,
    the first dispersing element is arranged to make the light ray representing the first color component incident on the first photosensitive cell and also make the light ray representing the second color component incident on a pair of the second photosensitive cells which are adjacent to the first photosensitive cell, and
    the second dispersing element is arranged to make the light ray representing the third color component incident on the third photosensitive cell and also make the light ray representing the fourth color component incident on a pair of the fourth photosensitive cells which are adjacent to the third photosensitive cell.

2. The solid-state image sensor of claim 1, wherein the plurality of high-refractive-index transparent portions have the shape of plates which intersect with the image capturing section at right angles and are arranged parallel to each other.

3. The solid-state image sensor of claim 2, wherein in two pairs of dispersing elements which face two adjacent ones of the plurality of unit blocks of the photosensitive cell array, the plurality of high-refractive-index transparent portions included in one of the two pairs intersect at right angles with the plurality of high-refractive-index transparent portions included in the other pair.

4. The solid-state image sensor of claim 2, wherein the plurality of high-refractive-index transparent portions are arranged so as to face the first and third photosensitive cells, and
  each of the second and fourth photosensitive cells faces a region between two adjacent ones of the high-refractive-index transparent portions in the dispersing element array.

5. The solid-state image sensor of claim 4, further comprising a micro lens array in which a plurality of micro lenses, each condensing light onto an associated dispersing element, are arranged.

6. The solid-state image sensor of claim 5, wherein the plurality of micro lenses are comprised of a first micro lens which condenses light onto the first dispersing element and a second micro lens which condenses light onto the second dispersing element, and
  wherein each of the first and second micro lenses partially covers the second and fourth photosensitive cells.

7. The solid-state image sensor of claim 1, wherein the first through fourth photosensitive cells are arranged in two columns and two rows in each said unit block.

8. The solid-state image sensor of claim 1, wherein the first and second photosensitive cells are alternately arranged in a first direction on the imaging area,
  the third and fourth photosensitive cells are alternately arranged in the first direction on the imaging area,
  the first and fourth photosensitive cells are alternately arranged in a second direction which intersects with the first direction on the imaging area, and
  the second and third photosensitive cells are alternately arranged in the second direction on the imaging area.

9. The solid-state image sensor of claim 1, wherein the first and second photosensitive cells are alternately arranged in a first direction on the imaging area,
  the third and fourth photosensitive cells are alternately arranged in the first direction on the imaging area,
  the first and third photosensitive cells are alternately arranged in a second direction which intersects with the first direction on the imaging area, and
  the second and fourth photosensitive cells are alternately arranged in the second direction on the imaging area.

10. The solid-state image sensor of claim 1, wherein the high-refractive-index transparent portions included in the first and second dispersing elements have the shape of plates which intersect with the imaging area at right angles and have mutually different heights.

11. The solid-state image sensor of claim 10, wherein the high-refractive-index transparent portion included in the first dispersing element is configured to transmit a light ray representing the first color component and diffract a light ray representing a color component other than the first color component in a predetermined direction to produce a light ray representing the second color component, and
  the high-refractive-index transparent portion included in the second dispersing element is configured to transmit a light ray representing the third color component and diffract a light ray representing a color component other than the third color component in the predetermined direction to produce a light ray representing the fourth color component.

12. The solid-state image sensor of claim 1, wherein the first and third photosensitive cells are alternately arranged in a first direction on the imaging area,
  the second and fourth photosensitive cells are alternately arranged not only in the first direction but also in a second direction which intersects with the first direction on the imaging area,
  the first photosensitive cells are arranged in the second direction on the imaging area, and
  the third photosensitive cells are arranged in the second direction on the imaging area.

13. The solid-state image sensor of claim 12, wherein the high-refractive-index transparent portions included in the first and third photosensitive cells that are alternately arranged in the first direction are parallel to each other,
  the high-refractive-index transparent portions included in the first photosensitive cells that are arranged in the second direction intersect with each other at right angles, and
  the high-refractive-index transparent portions included in the third photosensitive cells that are arranged in the second direction intersect with each other at right angles.

14. The solid-state image sensor of claim 1, wherein the high-refractive-index transparent portions included in the first and second dispersing elements have mutually different shapes and/or sizes.

15. The solid-state image sensor of claim 14, wherein the high-refractive-index transparent portion included in the first dispersing element is configured to transmit a light ray representing the first color component and diffract a light ray representing a color component other than the first color component perpendicularly to the high-refractive-index transparent portion to produce a light ray representing the second color component, and
  the high-refractive-index transparent portion included in the second dispersing element is configured to transmit a light ray representing the third color component and diffract a light ray representing a color component other than the third color component perpendicularly to the high-refractive-index transparent portion to produce a light ray representing the fourth color component.

16. The solid-state image sensor of claim 11, wherein the first color component is the color green and the third color component is the color cyan.

17. An image capture device comprising:
  the solid-state image sensor of claim 1;
  an optical system which produces a subject image on the imaging area of the solid-state image sensor; and
  an image processing section which processes the output signal of the solid-state image sensor.

* * * * *